(12) United States Patent
Glancy et al.

(10) Patent No.: US 10,068,634 B2
(45) Date of Patent: Sep. 4, 2018

(54) SIMULTANEOUS WRITE AND READ CALIBRATION OF AN INTERFACE WITHIN A CIRCUIT

(71) Applicant: INTERNATIONAL BUSINESS MACHINES CORPORATION, Armonk, NY (US)

(72) Inventors: Stephen P. Glancy, Poughkeepsie, NY (US); Gary A. Van Huben, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 71 days.

(21) Appl. No.: 15/071,203

(22) Filed: Mar. 16, 2016

(65) Prior Publication Data

US 2017/0270994 A1   Sep. 21, 2017

(51) Int. Cl.
| | |
|---|---|
| G11C 7/00 | (2006.01) |
| G11C 11/4076 | (2006.01) |
| G11C 11/4096 | (2006.01) |
| G11C 11/406 | (2006.01) |
| G11C 29/12 | (2006.01) |

(52) U.S. Cl.
CPC ...... *G11C 11/4076* (2013.01); *G11C 11/4096* (2013.01); *G11C 11/40626* (2013.01); *G11C 29/12015* (2013.01)

(58) Field of Classification Search
CPC .......... G11C 11/4076; G11C 29/12015; G11C 11/4096; G11C 11/40626
See application file for complete search history.

(56) References Cited

U.S. PATENT DOCUMENTS

| 6,079,038 A | 6/2000 | Huston et al. |
| 6,876,207 B2 | 4/2005 | Hass et al. |
| 7,107,476 B2 | 9/2006 | Jeong et al. |
| 7,133,790 B2 | 11/2006 | Liou et al. |
| 7,321,991 B2 | 1/2008 | An |

(Continued)

FOREIGN PATENT DOCUMENTS

| CN | 102006091 | 4/2011 |
| CN | 102916759 | 2/2013 |
| JP | 2014229335 | 12/2014 |

OTHER PUBLICATIONS

Freescale Semiconductor, "I.MX 6 Series DDR Calibration", Document No. AN4467, Rev. 2, Mar. 2015, 50 Pages.

(Continued)

*Primary Examiner* — Mohammed A Bashar
(74) *Attorney, Agent, or Firm* — Joseph Petrokaitis; Amy J. Pattillo

(57) ABSTRACT

To calibrate an electronic circuit, a calibration controller tests the electronic circuit with an initial separate read check allowing for a read delay and with an initial separate write check allowing for a write delay. The calibration controller, responsive to passing the initial read check and the initial write check, for each condition of a range of conditions, iteratively performs a write test with the write delay concurrent with a read test with the read delay on the electronic circuit over the range of conditions while simultaneously adjusting the write delay and adjusting the read delay for each iteration until one or more of a read edge and a write edge are detected.

18 Claims, 8 Drawing Sheets

(56) References Cited

U.S. PATENT DOCUMENTS

| | | | |
|---|---|---|---|
| 7,701,801 B2 | 4/2010 | Joshi et al. | |
| 7,865,660 B2 | 1/2011 | Guo et al. | |
| 8,286,044 B2 | 10/2012 | Foster, Sr. et al. | |
| 8,565,033 B1* | 10/2013 | Manohararajah | G11C 29/028 365/129 |
| 8,659,959 B2 | 2/2014 | Kim et al. | |
| 8,693,246 B2 | 4/2014 | Roohparvar et al. | |
| 9,401,197 B2 | 7/2016 | Jeon et al. | |
| 2006/0164909 A1 | 7/2006 | Gower et al. | |
| 2009/0031091 A1 | 1/2009 | Chang et al. | |
| 2009/0161453 A1* | 6/2009 | Giovannini | G11C 7/1078 365/193 |
| 2010/0146237 A1* | 6/2010 | Takai | G11C 7/1066 711/167 |
| 2010/0188919 A1 | 7/2010 | Fox et al. | |
| 2011/0222358 A1* | 9/2011 | Ware | G06F 13/1689 365/189.15 |
| 2011/0258475 A1 | 10/2011 | Lee et al. | |
| 2014/0016404 A1 | 1/2014 | Kim et al. | |
| 2014/0046466 A1 | 2/2014 | Bickford et al. | |
| 2014/0185384 A1 | 7/2014 | Kim et al. | |
| 2014/0189224 A1 | 7/2014 | Kostinsky et al. | |
| 2014/0328132 A1 | 11/2014 | Cordero et al. | |
| 2016/0209866 A1* | 7/2016 | Jeter | G06F 1/08 |

OTHER PUBLICATIONS

Lee et al, "25.2 A 1.2 V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), Feb. 12, 2014, pp. 432-433, 3 pages.

"System and Method for Performance Optimized Periodic Memory Calibration", IP.Com, IPCOM000225341D, Feb. 11, 2013, 5 pages.

DQ I/O, Altera Corporation, 2005-2015, accessed via the Internet from <http://quartushelp.altera.com/15.0/mergedProjects/reference/glossary/def_dq_io.htm> as of Feb. 7, 2017, 1 page.

U.S. Appl. No. 15/458,965, filed Mar. 14, 2017, In re Glancy, 75 pages.

Office Action, dated Sep. 25, 2017, U.S. Appl. No. 15/458,965, filed Mar. 14, 2017, In re Glancy, 39 pages.

Notice of Allowance, dated May 22, 2018, U.S. Appl. No. 15/458,965, filed Mar. 14, 2017, In re Glancy, 32 pages.

* cited by examiner

SIMULTANEOUS WRITE AND READ CALIBRATION OF AN INTERFACE WITHIN A CIRCUIT

BACKGROUND

1. Technical Field

This invention relates in general to a memory system calibration and more particularly to simultaneous write and read calibration of an interface within a circuit.

2. Description of the Related Art

Computing systems generally include one or more circuits with one or more memory or storage devices connected to one or more processors via one or more controllers. Timing variations, frequency, temperature, aging and other conditions impact data transfer rates to and from memory or other storage, which impacts computer system performance. Given the high clock rates and fast edge speed used in many computer systems, timing variations and timing skews from one system implementation to another are challenging to calibrate, especially for systems with larger amounts of memory and a greater overall width of the memory bus.

BRIEF SUMMARY

In one embodiment, a method for calibrating an electronic circuit is directed to testing an electronic circuit with an initial separate read check allowing for a read delay. The method is directed to testing the electronic circuit with an initial separate write check allowing for a write delay. The method is directed to, responsive to the read check results of the initial separate read check not passing, performing a first shmoo characterization adjusting the read delay only. The method is directed to, responsive to the read check results failing at the end of the first shmoo characterization, ending the testing of the electronic circuit with an error. The method is directed to, responsive to the read check results passing at the end of the first shmoo characterization, testing the electronic circuit with an initial separate write check allowing for a write delay. The method is directed to, responsive to the write check results of the initial separate write check not passing, performing a second shmoo characterization adjusting the write delay only. The method is directed to, responsive to the write check results failing at the end of the second shmoo characterization, ending the testing of the electronic circuit with an error. The method is directed to, responsive to the write check results passing at the end of the second shmoo characterization, for each condition of a range of conditions, iteratively performing, a write test with the write delay concurrent with a read test with the read delay on the electronic circuit over the range of conditions while simultaneously adjusting the write delay and the read delay for each iteration until one or more of a read edge and a write edge are detected.

In another embodiment, a computer system comprises one or more processors, one or more computer-readable memories, one or more computer-readable storage devices, and program instructions, stored on at least one of the one or more storage devices for execution by at least one of the one or more processors via at least one of the one or more memories. The stored program instructions comprise program instructions to test an electronic circuit with an initial separate read check allowing for a read delay. The stored program instructions comprise program instructions to responsive to the read check results of the initial separate read check not passing, perform a first shmoo characterization adjusting the read delay only. The stored program instructions comprise program instructions to, responsive to the read check results failing at the end of the first shmoo characterization, end the testing of the electronic circuit with an error. The stored program instructions comprise program instructions to, responsive to the read check results passing at the end of the first shmoo characterization, test the electronic circuit with an initial separate write check allowing for a write delay. The stored program instructions comprise program instructions to, responsive to the write check results of the initial separate write check not passing, perform a second shmoo characterization adjusting the write delay only. The stored program instructions comprise program instructions to, responsive to the write check results failing at the end of the second shmoo characterization, end the testing of the electronic circuit with an error. The stored program instructions comprise program instructions, responsive to the write check results passing at the end of the second shmoo characterization, for each condition of a range of conditions, to iteratively perform, a write test with the write delay concurrently with a read test with the read delay on the electronic circuit over the range of conditions while simultaneously adjusting the write delay and the read delay for each iteration until one or more of a read edge and a write edge are detected.

In another embodiment, a computer program product comprises one or more computer-readable storage devices and program instructions, stored on at least one of the one or more storage devices. The stored program instructions comprise program instructions to test an electronic circuit with an initial separate read check allowing for a read delay. The stored program instructions comprise program instructions to responsive to the read check results of the initial separate read check not passing, perform a first shmoo characterization adjusting the read delay only. The stored program instructions comprise program instructions to, responsive to the read check results failing at the end of the first shmoo characterization, end the testing of the electronic circuit with an error. The stored program instructions comprise program instructions to, responsive to the read check results passing at the end of the first shmoo characterization, test the electronic circuit with an initial separate write check allowing for a write delay. The stored program instructions comprise program instructions to, responsive to the write check results of the initial separate write check not passing, perform a second shmoo characterization adjusting the write delay only. The stored program instructions comprise program instructions to, responsive to the write check results failing at the end of the second shmoo characterization, end the testing of the electronic circuit with an error. The stored program instructions comprise program instructions, responsive to the write check results passing at the end of the second shmoo characterization, for each condition of a range of conditions, to iteratively perform, a write test with the write delay concurrently with a read test with the read delay on the electronic circuit over the range of conditions while simultaneously adjusting the write delay and the read delay for each iteration until one or more of a read edge and a write edge are detected.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
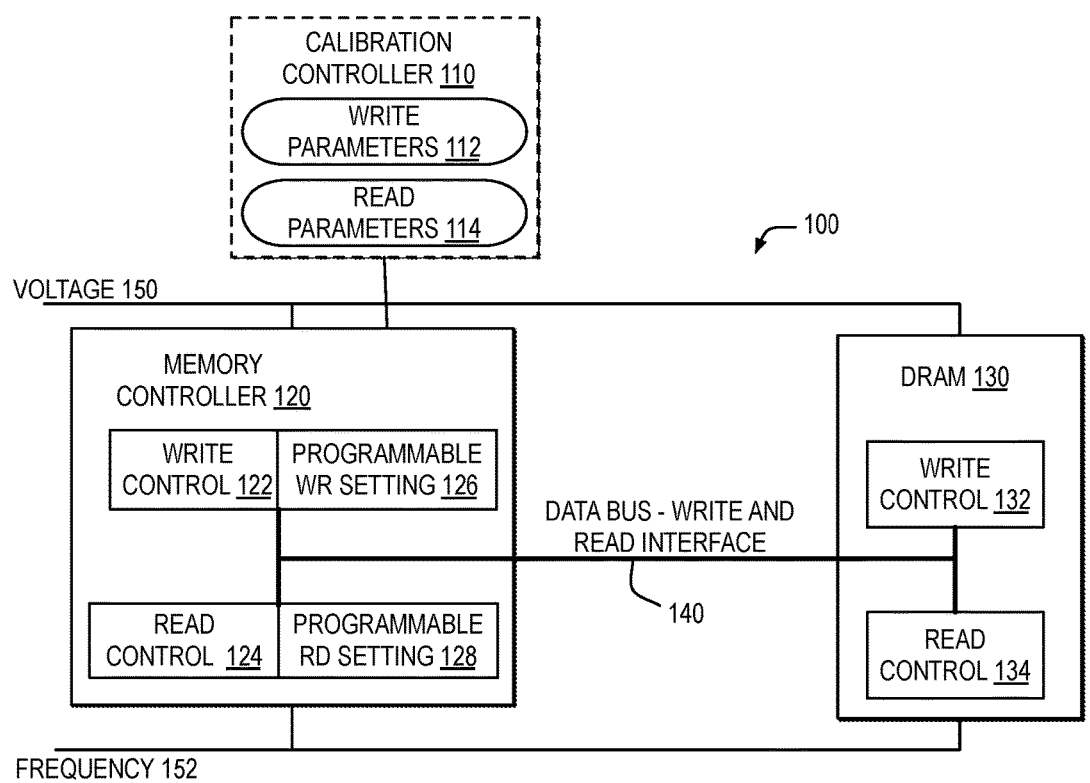
FIG. 1 is a block diagram illustrating one example of an electronic circuit including a calibration controller for managing simultaneous write and read calibration of an interface within the electronic circuit.

FIG. 1 illustrates a block diagram of one example of an electronic circuit including a calibration controller for managing simultaneous write and read calibration of an interface within the electronic circuit.

In the example, an electronic circuit 100 includes multiple circuit elements, including, but not limited to, a memory controller 120 and a dynamic random-access memory (DRAM) 130 directly coupled to one another through a data bus 140. In one example, memory controller 120 and DRAM 130 may represent a memory module, such as a SIMM or a DIMM. DRAM 130 may generally include one or more types of memory including, but not limited to dynamic random access memory (DRAM), static random access memory (SRAM), and electrically erasable programmable read-only memory (EEPROM), and other types of non-volatile memories.

In addition, in one example, memory controller 120 and DRAM 130 may represent other types of circuit elements, including, but not limited to, a processor chip with direct attach memory and a storage controller chip. Electronic circuit 100 may represent an integrated circuit (IC), an application specific IC (ASIC), or a microprocessor. In additional or alternate examples, electronic circuit 100 may represent any type of system that transmits data bidirectionally or unidirectionally between a controller and a chip.

In one example, data bus 140 may generally include any type of communication channel, which can be used to transmit data between a controller and memory. In particular, as illustrated in FIG. 1, data bus 140 represents a bidirectional channel which includes a write interface to transmit write commands and data from a write control 122 of memory controller 120 to a write control 132 of DRAM 130 and includes a read interface to transmit read commands and data from read control 134 of DRAM 130 to read control 124 of memory controller 120. In one example, each of write control 122, read control 124, write control 132, and read control 134 may represent different combinations of hardware elements and different types of transmitters and receivers.

In one example, each of memory controller 120 and DRAM 130 may include multiple input interfaces. In one example, one input interface of each of memory controller 120 and DRAM 130 receives a voltage 150. In another example, another input interface of each of memory controller 120 and DRAM 130 receives a frequency 152. In one example, the settings of each of voltage 150 and frequency 152 may be dynamically adjustable.

In one example, electronic circuit 100 may operate over a range of one or more types of conditions. In one example, examples of the range of one or more types conditions at which electronic circuit 100 operates may include, but are not limited to, a range of voltage settings of voltage 150, a range of frequency settings of frequency 152, a range of timing parameters, and a range of temperature refresh rates. In one example, the range of voltage settings of voltage 150 may refer to a range of reference voltage settings. In additional or alternate embodiments, reference voltage settings may be separately set for each of the write and read reference voltage settings of voltage 150. Additional conditions that may impact operation may include timing, aging, and temperature. In additional or alternate examples, electronic circuit 100 may be impacted by additional or alternate types of conditions and one or more ranges of each type of condition.

In one example, the performance of electronic circuit 100 may be impacted by the range of conditions under which electronic circuit 100 operates. In one example, there may be a particular set of parameters within the range of conditions that allow for optimized operation within electronic circuit 100, however, operation of electronic circuit 100 within the optimized parameters requires calibration of one or more programmable, configurable settings within electronic circuit for the specific configuration of elements within electronic circuit 100. In addition, as electronic circuit 100 operates and temperature and other conditions cause timing skews, operation of electronic circuit 100 within the optimized parameters requires continued calibration of one or more programmable, configurable settings within electronic circuit.

In particular, the timing of write data and read data on data bus 140, within the external interface between memory controller 120 and DRAM 130, impacts the performance of electronic circuit 100. In one example, to manage performance of electronic circuit 100, there may be a first set of write parameters 112 set for write operations and write data and a second set of read parameters 114 set for read operations and read data. Write parameters 112 indicate latencies and windows of time acceptable for write data on the external interface of data bus 140. Read parameters 114 indicate latencies and windows of time acceptable for read data on the external interface of data bus 140. When the timing of write data packets falls outside the edges, horizontally or vertically, of acceptable windows of time within write parameters 112 or read data packets fall outside the edges, horizontally or vertically, of acceptable windows of time within read parameters 114, the performance of electronic circuit 100 may diminish or fail. In one example, write parameters 112 and read parameters 114 are separate sets of parameters that are unrelated to one another and are impacted by different sets of circuitry within write and read interfaces and controls.

In one example, to configure data bus 140 such that write data latencies meet write parameters 112 and read data latencies meet the read parameters 114, across ranges of conditions, each of the write interface and the read interface are separately tunable. In one example, read data latencies on data bus 140 are tunable through a programmable RD setting 128 for the read interface. In one example, write data latencies on data bus 140 are tunable through a programmable WR setting 126 for the write interface. In one example, each of programmable RD setting 128 and programmable WR setting 126 may include multiple types of configurable settings including, but not limited to, time delay settings and voltage reference (VREF) settings.

In one example, to tune the write timing on data bus 140, a timing delay setting of programmable WR setting 126 may be set to selectively delay the timing of data output from write control 122 onto data bus 140. In one example, to tune the read timing on data bus 140, a timing delay setting of programmable RD setting 128 may selectively delay the timing of data received as input from data bus 140 to read control 124. In particular, in one example, a core clock element may run to each of the components within memory controller 120, wherein programmable WR setting 126 separately delays the core clock element that runs to write control 122 and programmable RD setting 128 separately delays the core clock element that runs to read control 124.

In one example, to center the VREF for write data on data bus 140, programmable WR setting 126 may also be configured to separately control a VREF for the write interface of data bus 140 to write control 122. In one example, to center the VREF for read operations on data bus 140, programmable RD setting 128 may also be configured to separately control a VREF for the read interface of data bus 140 to read control 140. In one example, to configure the VREF for within each of programmable WR setting 126 and programmable RD setting 128, one or more values may be specified in order to center the voltage reference level between the limits of the TTL output swing, such as by setting resistor levels.

In one example, each of programmable WR setting 126 and programmable RD setting 128 may be set manually or may be set dynamically by a calibration controller 110 prior to and during operations of memory controller 120. In one example, one or more functions of calibration controller 110 may be performed by firmware or software that runs on electronic circuit 100. In another example, one or more functions of calibration controller 110 may be performed by a tester controller external to electronic circuit 100 that is connected to electronic circuit 100. In another example, one or more functions of calibration controller 110 may be a hardware element of electronic circuit 100 within memory controller 120 or DRAM 130 or as an independent component within electronic circuit 100. In addition, one or more functions of calibration controller 110 may be distributed across a combination of hardware and software elements within electronic circuit 100 and external to electronic circuit 100.

In addition, for running tests on electronic circuit 100, in one example, calibration controller 110 may load one or more test patterns into electronic circuit. In another example, one or more components of electronic circuit 100 may include internal test patterns or built in testing controllers for generating test patterns, where calibration controller 110 may run tests on electronic circuit 100 by triggering one of the internal tests or built in test controllers within electronic circuit 100.

In one example, calibration controller 110 performs one or more types of tests to adjust the settings of programmable WR setting 126 to tune and center write data timing to meet write parameters 112 and to adjust the settings of programmable RD setting 128 to tune and center read data timing to meet read parameters 114. In the example, programmable WR setting 126 and programmable RD setting 128 are separate settings. In one example, to tune the settings of programmable WR setting 126 and programmable RD setting 128, generally, calibration controllers, such as calibration controller 110, may perform read and write calibrations or characterization shmoos by running read and write tests for calibrations and shmoos separately, first running read tests to calibrate programmable RD setting 128 only and second running write and read tests to calibrate programmable WR setting 126 only. In particular, read calibrations may be separately conducted by calibration controller 110 using read shmoos that read to multi-purpose registers (MPRs) of DRAM 130. In particular, write calibrations may be separately conducted by calibration controller 110 using write and read patterns for characterization shmoos, which duplicate the read commands issued during the read calibration.

In one example, a "shmoo" may refer to a name for a type of characterization or plot produced by calibration controller 110 based on testing of electronic circuit 100 or the type of testing performed to generate a "shmoo characterization". In one example calibration controller 110 may run multiple read tests, under different combinations of conditions within the range of conditions, and generate a "shmoo characterization" that provides a graphical representation of the ability of electronic circuit 100 to operate in response to various combinations of two variable operating conditions. For example, calibration controller 110 may repeatedly test electronic circuit 100 using different combinations of settings for voltage 150 and frequency 152 and characterize the results by plotting the results in a graph. For example, by plotting the results of the different combinations of settings for voltage 150 on an X-axis and frequency 152 only the y-axis, along with the testing results, in a graph, calibration controller 110 may determine which of the combinations of operating parameters for voltage and frequency yield results that "pass" or "fail" according to write parameters 112 or read parameters 114. In one example, a shmoo characterization may depict the operating limits of circuit 100 with respect to the various combinations of multiple operation conditions.

In one example, though a shmoo characterization is useful for detecting settings of conditions that "pass" within the parameters for a circuit, running a sufficient number of tests to produce the shmoo characterization requires calibration controller 110 to perform a significant number of tests. In addition, calibration through shmoos takes even more time if a multi-dimensional shmoo is performed, where a multi-dimensional shmoo may include adjusting additional operating conditions and adding an additional axis to the graph for each additional operating condition. In addition, calibration through shmoos takes even more time as the number of components within electronic circuit 100 increases.

In one example, calibration controller 110 may be enabled to separately perform read and write calibrations of programmable RD setting 128 and programmable WR setting 126, as previously described, by first running a read test for a range of delay settings in programmable RD setting 128 only first and then, separately running the write test for a range of delay settings in programmable WR setting 126 only, which requires calibration time for running each of the tests for each of the range of delays. For example, if the read test is run for a range of 10 delays in programmable RD setting 128 only and then a write test is separately run for a range of 10 delays in programmable WR setting 126 only, calibration controller 110 would require calibration time for setting delays 20 times total.

However, to reduce the calibration time required for testing ranges of delays in programmable RD setting 128 and programmable WR setting 126, in the present invention, calibration controller 110 may simultaneously conduct write and read calibrations or characterization shmoos to reduce the calibration time required for testing a range of delay settings. For example, using simultaneous write and read calibrations, for testing a range of 10 delays in each of programmable RD setting 128 and programmable WR setting 126, calibration controller 110 simultaneously sets each of programmable RD setting 128 and programmable WR setting 126 for a write and read test, only requiring calibration time for setting delays 10 total times, which significantly reduces the calibration time required.

In particular, to fully test for the write edges and read edges indicated by failures across a range of delay settings, calibration controller 110 may conduct one or both of fine timing delay and voltage reference (VREF) centering through simultaneous write and read calibration or characterization shmoos. In particular, simultaneously conducting write and read calibrations or characterization shmoos includes simultaneously adjusting programmable RD setting 128 to meet read parameters 114 and adjusting programmable WR setting 126 to meet write parameters 112, for a range of delay settings, which avoids duplication of efforts with regard to read calibration and shmoos that occurs if read calibration of programmable RD setting 128 and write calibration of programmable WR setting 126 are performed separately for a range of delay settings, and allows for faster overall performance of calibration operations.

In one example, calibration controller 110 may periodically perform simultaneous write and read calibrations or characterization shmoos while electronic circuit 100 is running in a system. In particular, once programmable WR setting 126 and programmable RD setting 128 are initially set upon initialization of a system or a new component, while electronic circuit 100 is operating, the settings may degrade over time due to conditions such as temperature and aging, requiring that the settings be periodically reassessed and updated. Calibration testing and delay programming requires memory system bandwidth, therefore there is a need for efficient calibration testing by calibration controller 110, such as by performing simultaneous write and read calibrations, to minimize the required memory system bandwidth required to adjust for incorrect timing delay settings and VREF settings in programmable WR setting 126 and programmable RD setting 128.

Calibration controller 110 may perform simultaneous write and read calibrations or characterization shmoos using one or more types of write and read tests including, but not limited to a 20× WR and 20× RD or a WR/RD 20×. In addition, in one example, calibration controller 110 may perform simultaneous write and read calibrations or characterization shmoos with multiple types of search algorithms. For example, calibration controller 110 may simultaneously perform write calibrations or shmoos with binary shmoos and perform read calibrations or shmoos linearly.

In one example, to simultaneously conduct read and write calibrations or characterization shmoos, calibration controller 110 may monitor for failures and determine the cause of the failures, whether from write or from a read. In one example, calibration controller 110 may assume that failures are not due to bad DRAMs or to bus turnaround time, but are due to the setting of one or more of the conditions to a value in the range that is outside optimal performance parameters.

In one example, calibration controller 110, in a first stage of simultaneously conducting read and write calibrations and characterization shmoos, may first run an initial calibration check. In the initial calibration check, calibration controller 110 may first run an initial read check and second runs an initial write check, to determine a safe read delay setting of a passing read delay or to determine whether there is a failure in electronic circuit 100 that cannot be calibrated to. In one example, in running an initial read check, calibration controller 110 tests the read data timing for the current settings in programmable RD setting 128 against read parameters 114. If the initial read check fails, then calibration controller 110 performs a calibration through varying a shmoo characterization for programmable RD setting 128 only, and if the read timing is still failing at the end of the shmoo characterization, then calibration controller 110 outputs an error and the calibration check ends. If a passing read delay setting is found or if the read timing is not failing at the end of the shmoo characterization for programmable RD setting 128, then calibration controller 110 may set the passing read delay setting as a "safe read" setting and perform an initial write check. In running an initial write check, calibration controller 110 tests write data timing for the current settings in programmable WR setting 126 against write parameters 112. If the initial write check fails, then calibration controller 110 performs a calibration through varying a shmoo characterization for programmable WR setting 126 only, and if the write timing is still failing at the end of the shmoo characterization, then calibration controller 110 outputs an error and the calibration check ends. If a passing write delay setting is found or if the write timing is not failing at the end of the shmoo characterization for programmable WR setting 126 only, then calibration controller 110 may set the passing write delay setting as a "safe write" setting and start the combined, simultaneous write and read calibration and shmoo characterization check. In the example, by performing the initial read check, if a current setting in programmable RD setting 128 is passing, no additional calibration is required for the initial read check and the initial read check quickly provides a "safe read" setting; if the setting in programmable RD setting 128 is not passing, then calibration controller 110 only needs to adjust the setting in programmable RD setting 128 until a passing delay setting is identified or there is no passing configuration available, but not necessarily to test a range of different delay settings. Similarly, by performing the initial write check, if a current setting in programmable WR setting 126 is passing, no additional calibration is required for the initial write check and the initial write check provides a "safe write" setting; if the setting in programmable WR setting 126 is not passing, then calibration controller 110 only needs to adjust the setting in programmable WR setting 126 until a passing delay setting is identified or there is no passing configuration available.

In one example, in a second stage of the combined calibration and shmoo characterization check, calibration controller 110 starts by simultaneously updating the setting in programmable WR setting 126 and programmable RD setting 128 for running a combined check. Next, calibration controller 110 conducts a combined write and read test and compares the combined results with write parameters 112 and read parameters 114. If the combined write and read test results do not fail in write parameters 112 or read parameters 114, then calibration controller 110 sets programmable WR setting 126 and programmable RD setting 128 to a next selection of test values, adjusting the time delay and VREF settings, and runs the combined write and read test on the next selection of test values for both the adjusted write delay and the adjusted read delay. In one example, if the combined write and read test results both pass write parameters 112 and read parameters 114, then the results fall within the window allowed for write data and read data and a determination is made that no write edge or read edge was identified. In the example, because the combined write and read test results pass write parameters 112 and read parameters 114, for the tested setting of programmable WR setting 126 and programmable RD setting 128, the combined result has passed without needing to separately run a read test to test read operations and then run a write test that includes write and read operations.

If the combined write and read test results do fail for write parameters 112 or read parameters 114, then calibration controller 110 performs additional steps to determine the cause of the fail. In one example, to determine the cause of the fail, calibration controller 110 may first return programmable RD setting 128 to a "safe read" setting, where the safe read setting is a previous setting of programmable RD setting 128 that passed during the initial read check. In the example, the read portion of the WR/RD test is re-read using the safe read setting and the combined results compared with write parameters 112 and read parameters 114. If the combined results of the read portion of the WR/RD test fail, then a write edge is identified, where the write edge indicates that the write data results fell outside the window allowed for write data. In addition, if a write edge is found, then the data is re-written with a known "safe write" setting in programmable WR setting 126 and the read portion re-read, to ensure that the read settings did not fail at the same time as the write settings. However, if the combined results of the read portion of the WR/RD test do not fail, then a read edge is identified, where the read edge indicates that the read data results fell outside the window allowed for read data. In one example, once a read edge or a write edge is identified, calibration controller 110 may adjust the settings in programmable WR setting 126 and programmable RD setting 128 again and conduct the combined write and read test again. Once one or more read edges and one or more write edges have been identified, calibration controller 110 may exit the calibration.

In one example, in FIG. 1, in addition to calibration controller 110 detecting timing parameter failures, determining whether the write, read or both failed, and determining the horizontal write edge, read edge, or both, calibration controller 110 may detect VREF failures and similarly determine whether the write, read or both failed, and determine the vertical write edge, read edge or both. In one example, write and read data may pass timing parameter requirements, but fail VREF requirements. In another example, one or both of write and read data may fail timing parameter requirements and fail VREF requirements. In addition, while timing parameter failures may be described with regard to horizontal write edge and horizontal read edge and VREF failures may be described with regard to vertical write edge and vertical read edge, in additional or alternate embodiments, timing parameter failures may be described with regard to another dimension, such as vertical write edge and vertical read edge, and VREF failures may be described with regard to another dimension, such as horizontal write edge and horizontal read edge.

Figure 2:
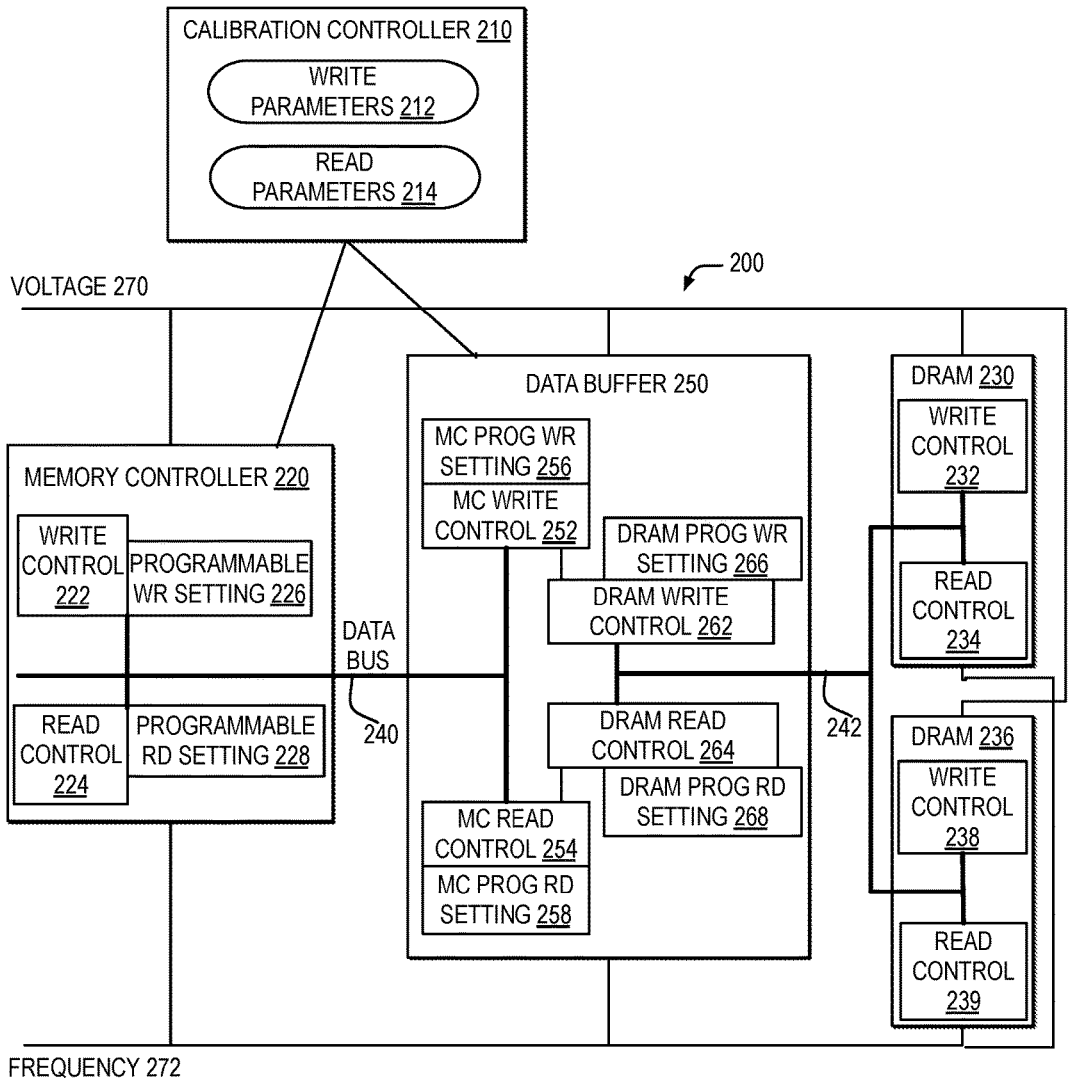
FIG. 2 is a block diagram illustrating one example of an electronic circuit including a calibration controller for managing simultaneous write and read calibration within the electronic circuit including a data buffer between a memory controller and memory units.

FIG. 2 illustrates a block diagram of one example of an electronic circuit including a calibration controller for managing simultaneous write and read calibration within the electronic circuit including a data buffer between a memory controller and memory units.

In the example, an electronic circuit 200 includes multiple circuit elements, including, but not limited to, a memory controller 220, which operates in a similar manner as described with reference to memory controller 210 of FIG. 1, connected to multiple memory units, such as a DRAM 230 and a DRAM 236, through a data buffer 250.

In one example, memory controller 220 is coupled to data buffer 250 through a data bus 240. In particular, data bus 240 may represent a bidirectional channel which includes a write interface to transmit write commands and data from a write control 222 of memory controller 220 to a memory controller (MC) write control 252 of data buffer 250 and which includes a read interface to transmit read commands and data from an MC read control 254 of data buffer 250 to read control 124 of memory controller 220. In one example, MC write control 252 is coupled to a DRAM write control 262 within data buffer 250 and MC read control 254 is coupled to a DRAM read control 264 within data buffer 250.

In one example, data buffer 250 is coupled to DRAM 230 and DRAM 236 through a data bus 242. In particular, data bus 242 may represent a bidirectional channel which includes a write interface to transmit write commands and data from DRAM write control 262 to a write control 232 of DRAM 230 and a write control 238 of DRAM 236 and which includes a read interface to transmit read commands and data from a read control 234 of DRAM 230 and a read control 239 of DRAM 236 to DRAM read control 264 of data buffer 250.

In one example, memory controller 120 may include programmable WR setting 226 that is programmable to control the delay of write commands and data from write control 222 on the write interface of data bus 240. In addition, MC write control 252 may include an MC programmable (PROG) WR setting 256 that is programmable to control the delay of write commands and data from MC write control 252 on the coupling interface to DRAM write control 262. DRAM write control 262 may include a DRAM PROG WR setting 266 that is programmable to control the delay of write commands and data from DRAM write control 262 on data bus 242 to write control 232 and write control 238.

In addition, memory controller 220 may include programmable RD setting 228 that is programmable to control the delay of read commands and data from read control 224 on the read interface of data bus 240. In addition, MC read control 254 may include an MC PROG RD setting 258 that is programmable to control the delay of read commands and data between data bus 240 and a coupling interface to DRAM read control 264. DRAM read control 264 may include a DRAM PROG RD setting 268 that is programmable to control the delay of read commands and data between read control 234 and read control 239 on data bus 242 on the coupling interface to MC read control 254.

In one example, calibration controller 210 may perform read and write calibrations and characterization shmoos for electronic circuit 200 to calibrate the settings of programmable RD setting 228, MC PROG RD setting 258, and DRAM PROG RD setting 268 to a set of read parameters set for each of the interfaces in read parameters 214 and to calibrate the settings of programmable WR setting 226, MC PROG WR setting 256, and DRAM PROG WR setting 266 to a set of write parameters set for each of the interfaces in write parameters 212. In one example, write parameters 212 may be specified with separate parameters for each of the three WR settings or may be specified with a single parameter for programmable WR setting 226. In one example, read parameters 214 may be specified with separate parameters for each of the three RD settings or may be specified with a single parameter for programmable RD setting 228.

In one example, in the present invention, calibration controller 210 may simultaneously conduct write and read calibrations or characterization shmoos in a similar manner as described with reference to calibration controller 110. In particular, calibration controller 210 may conduct one or both of fine timing delay and voltage reference (VREF) centering through simultaneous write and read calibration or characterization shmoos. In particular, simultaneously conducting write and read calibrations or characterization shmoos includes simultaneously adjusting programmable RD setting 228, MC PROG RD setting 258, and DRAM PROG RD setting 268 to meet read parameters 214 and adjusting programmable WR setting 226, MC PROG WR setting 256, and DRAM PROG WR setting 266 to meet write parameters 212, which avoids duplication of efforts with regard to read calibration and shmoos that occurs if read calibration and write calibration are performed separately, and allows for faster overall performance of calibration operations.

In one example, to simultaneously conduct read and write calibrations or characterization shmoos, calibration controller 210 may monitor for failures and determine the cause of the failures, whether from write or from a read, and further which of the multiple read or write settings caused the failure based on the identifier of the write or read command from which the failure was registered. In one example, for simultaneously conducting read and write calibrations, a test may be run with 10 streaming writes and reads each, where the first 5 write and read commands in the stream are run at a setting A and the second 5 write and read commands in the stream are run at a setting B, within a same stream. If a failure is detected, then calibration controller 210 will further detect the identifier of the write or read command from which the failure was registered and determined whether the command was running during setting A or setting B. In one example, calibration controller 210 may assume that failures are not due to bad DRAMs or to bus turnaround time, but are due to the setting of one or more of the conditions to a value in the range that is outside optimal performance parameters.

In one example, calibration controller 210, in a first stage of simultaneously conducting read and write calibrations and characterization shmoos, may first run an initial calibration check. In the initial calibration check, calibration controller 210 first runs an initial read check and second runs an initial write check, to determine whether there is a failure in electronic circuit 200 that cannot be calibrated to. In one example, in running an initial read check, calibration controller 210 tests the read data timing for the current settings in programmable RD setting 228, MC PROG RD setting 258, and DRAM PROG RD setting 268 against read parameters 214. If the initial read check fails, then calibration controller 210 performs a calibration through a varying shmoo characterization for programmable RD setting 228 only, and if the read timing is still failing at the end of the shmoo characterization, then calibration controller 210 outputs an error and the calibration check ends. If the initial read check passes or if the read timing is not failing at the end of the shmoo characterization for programmable RD setting 228 only, then calibration controller 210 performs an initial write check. In running an initial write check, calibration controller 210 tests write data timing for the current settings in programmable WR setting 226, MC PROG WR setting 256, and DRAM PROG WR setting 266 against write parameters 212. If the initial write check fails, then calibration controller 210 performs a calibration through varying a shmoo characterization for programmable WR setting 226 only, and if the write timing is still failing at the end of the shmoo characterization, then calibration controller 210 outputs an error and the calibration check ends. If the initial write check passes or if the write timing is not failing at the end of the shmoo characterization for programmable WR setting 226 only, then calibration controller 210 starts the combined, simultaneous write and read calibration and shmoo characterization check.

In one example, for the combined calibration and shmoo characterization check, calibration controller 210 starts by updating the setting in programmable WR setting 226, MC PROG WR setting 256, and DRAM PROG WR setting 266 and in programmable RD setting 228, MC PROG RD setting 258, and DRAM PROG RD setting 268 for running a combined check. Next, calibration controller 210 conducts one or more combined write and read tests each with one or more data patterns and compares the combined results with write parameters 212 and read parameters 214. If the combined write and read test results do not fail in write parameters 212 or read parameters 214, then calibration controller 210 adjusts the values in programmable WR setting 226, MC PROG WR setting 256, and DRAM PROG WR setting 266 and in programmable RD setting 228, MC PROG RD setting 258, and DRAM PROG RD setting 268 to a next selection of test values, adjusting the time delay and VREF settings, and runs the one or more combined write and read tests each with one or more data patterns on the next selection of test values for both the adjusted write delay and the adjusted read delay. In one example, if the combined write and read test results both pass write parameters 212 and read parameters 214, then the results fall within the window allowed for write data and read data and a determination is made that no write edge or read edge was identified. In the example, because the combined write and read test results pass write parameters 212 and read parameters 214, for the tested setting of programmable WR setting 226, MC PROG WR setting 256, DRAM PROG WR setting 266, programmable RD setting 228, MC PROG RD setting 258, and DRAM PROG RD setting 268, the combined result has passed without needing to separately run a read test to test read operations and then run a write test that includes write and read operations.

If the combined write and read test results do fail for write parameters 212 or read parameters 214, then calibration controller 210 performs additional steps to determine the cause of the fail. In one example, to determine the cause of the fail, calibration controller 210 may first return programmable RD setting 228, MC PROG RD setting 258, and DRAM PROG RD setting 268 to a "safe read" setting, where the "safe read" setting is a previous setting of programmable RD setting 228, MC PROG RD setting 258, and DRAM PROG RD setting 268 that passed during the initial check. In the example, the WR/RD test is re-read using the "safe read" setting and the combined results compared with write parameters 212 and read parameters 214.

If the combined results fail, then a write edge is identified, where the write edge indicates that the write data results fell outside the window allowed for write data. In one example, if 3 write settings are simultaneously tested in one command stream, calibration controller 210 may compare the data received to the expected data for the number of commands issued for each command, with any failure marked. In the example, depending on the spot in the command stream where the failure is marked, calibration controller 210 may determine the setting at the time of the failure.

In addition, if a write edge is found, then the data is re-written with a known "safe write" setting and the read portion re-read, to ensure that the read settings did not fail at the same time as the write settings. If the combined results do not fail, then a read edge is identified, where the read edge indicates that the read data results fell outside the window allowed for read data. In one example, once a read edge or a write edge is identified, calibration controller 210 may adjust the settings in programmable WR setting 226, MC PROG WR setting 256, DRAM PROG WR setting 266, programmable RD setting 228, MC PROG RD setting 258, and DRAM PROG RD setting 268 again and conduct the one or more combined write and read tests each with one or more data patterns again. Once one or more read edges and one or more write edges have been identified, calibration controller 210 may exit the calibration.

Figure 3:
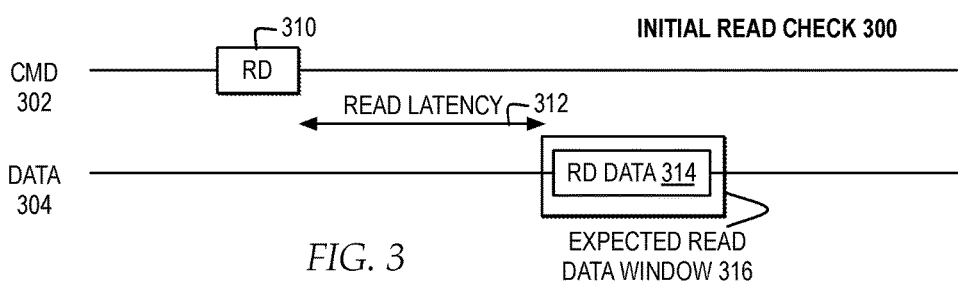
FIG. 3 is a timing diagram illustrating one example of an initial read check, allowing for a read delay, which passes.

FIG. 3 illustrates one example of a timing diagram of an initial read check, allowing for a read delay that passes.

In one example, a timing diagram of an initial read check 300 includes time frames for a command (CMD) 302 and data 304. In the example, a time frame for CMD 302 illustrates a read (RD) command 310 issued by read control 124, delayed by a programmable RD setting 128 that is initially set to a nominal delay setting. A time frame for data 304 illustrates read control 124 receiving read data 314 at a subsequent time after RD command 310 is issued. In the example, there is a read latency 312 between the issuance of read command 310 and the front edge of an expected read data window 316. In the example, expected read data window 316 illustrates the window of time during which the returned read data is expected as set in read parameters 114.

In the example in FIG. 3, because read data 314 is received within expected read data window 316, the initial read check passes and the read delay setting checked may be used as a "safe read" setting. In the example, if read data 314 were not received within read data window 316, the configuration controller would perform a shmoo characterization, adjusting the read delay only, and determine whether the read check is still failing at the end. If the read check is still failing at the end, then an error is output and the calibration check is ended.

In the example, in FIG. 3, by performing the initial read check, testing may require minimal time and bandwidth to determine a "safe read" setting. While FIG. 3 illustrates a single testing period, the minimized initial read check in FIG. 3 may be performed one or more times using one or more data patterns of multiple available data patterns in order to determine if the test passes or fails for the allowed read delay setting in programmable RD setting 128. For example, to further evaluate that an initial read check passes for a read delay setting, the read check may be re-read five or more times using multiple patterns for each read to further verify that a passing test is truly a passing test and to initially set the passing read delay as a safe setting for use during a subsequent simultaneous write and read calibration.

Figure 4:
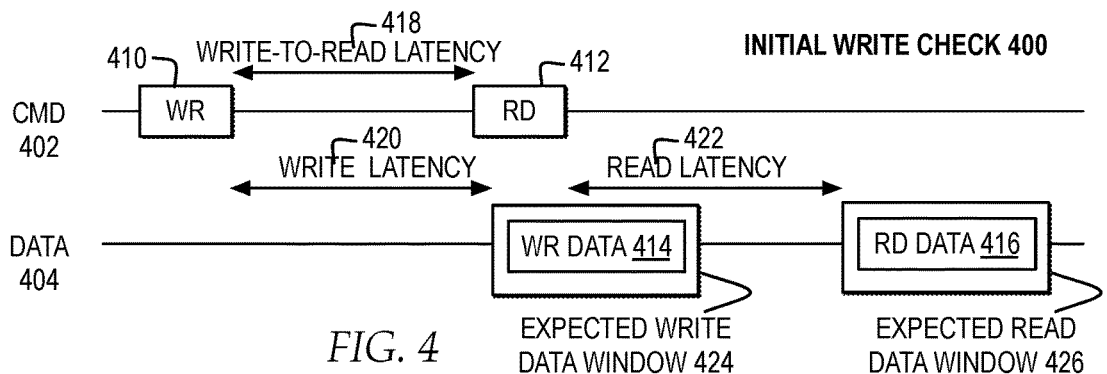
FIG. 4 is a timing diagram illustrating one example of an initial write check, allowing for a write delay, which passes.

FIG. 4 illustrates one example of a timing diagram of an initial write check, allowing for a write delay that passes.

In one example, a timing diagram of an initial write check 400 includes time frames for a command (CMD) 402 and data 404. In the example, a time frame for CMD 402 illustrates a write (WR) command 410 issuance by write control 122, delayed by a programmable WR setting 126 that is initially set to a nominal delay setting. A time frame for data 404 illustrates write control 122 sending write data 414 at a subsequent time after write command 410 is issued. In the example, there is a write latency 420 between the issuance of write command 410 and the front edge of an expected write data window 424. In the example, expected write data window 424 illustrates the window of time during which the write data is expected to be sent as set in write parameters 112. In addition, for a write check, a read command 412 may be issued after write command 410 to read the data written by write command 410 and verify that the write was completed. In one example, there is a latency between the time when write command 410 is issued and read command 412 is issued, referred to as a write-to-read latency 418. In the example, there is also a read latency 422 between the time when read command 412 is issued and when the written data is read, as read data 416. In the example, read data 416 is received within an expected read data window 426.

In the example in FIG. 4, because write data 414 is sent within expected write data window 424, the initial write check passes and the write delay setting checked may be used as a "safe write" setting. In the example, if write data 414 were not received within write data window 424, the configuration controller would perform a shmoo characterization, adjusting the write delay only, and determine whether the write check is still failing at the end. If the write check is still failing at the end, then an error is output and the calibration check is ended.

In the example, in FIG. 4, by performing the initial write check, testing may require minimal time and bandwidth to determine a "safe write" setting. While FIG. 4 illustrates a single testing period, the minimized initial write check in FIG. 4 may be performed one or more times using one or more data patterns of multiple available data patterns in order to determine if the test passes or fails for the allowed write delay setting in programmable WR setting 126. For example, to further evaluate that an initial write check passes for a write delay setting, the write check may be re-read five or more times using multiple patterns for each write and read test to further verify that a passing test is truly a passing test and to initially set the passing write delay as a safe setting for use during a subsequent simultaneous write and read calibration.

Figure 5:
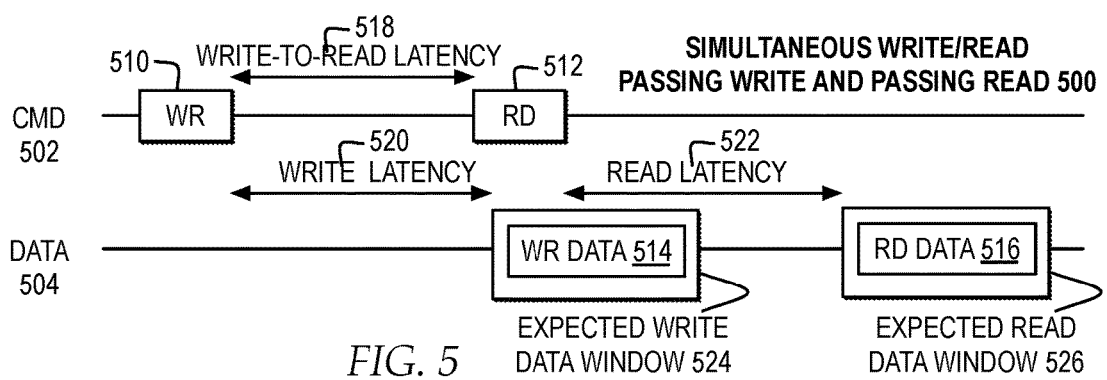
FIG. 5 is a timing diagram illustrating one example of a simultaneous write check, allowing a write delay, and a read check, allowing a read delay, which passes.

FIG. 5 illustrates one example of a timing diagram of a simultaneous write check, allowing a write delay, and a read check, allowing a read delay, which passes.

In one example, a timing diagram of a passing write and passing read result from a simultaneous, combined write and read test, with both programmable WR setting 126 and programmable RD setting 128 each simultaneously set to delayed settings before the write and read test is run, compared with both write parameters 112 and read parameters 114 includes time frames for a command (CMD) 502 and data 504. In the example, while in FIG. 4 a write and read test is illustrated, in the initial check illustrated in FIG. 4, programmable WR setting 126 and programmable RD setting 128 are not simultaneously set to nominal delayed settings before the read and write test is run.

In the example, a time frame for CMD 502 illustrates a write command 510 issued by write control 122, delayed by an adjusted programmable WR setting 126. A time frame for data 504 illustrates write control 122 sending write data 514 at a subsequent time after write command 510 is issued. In the example, there is a write latency 520 between the issuance of write command 510 and the front edge of an expected write data window 524. In the example, expected write data window 524 illustrates a horizontal position of the window of time during which the write data is expected to be sent as set in write parameters 112. In addition, for the simultaneous write and read check, a read command 512 may be issued by read control 124, delayed by an adjusted programmable RD setting 128, to read data. In one example, there is latency between the time when write command 510 is issued and read command 512 is issued, referred to as a write-to-read latency 518. In the example, there is also a read latency 522 between the time when read command 512 is issued and when the written data is read, as read data 516. In the example in FIG. 5, because the results of the simultaneous, combined write and read test result in write data 514 writing within expected write data window 524 and read data 516 being read within expected read data window 526, the simultaneous write and read test passes.

While FIG. 5 illustrates a single testing period, the write and read testing illustrated in FIG. 5 may be performed one or more times using one or more data patterns of multiple available data patterns in order to determine if the test passes or fails for the simultaneously set write delay setting in programmable WR setting 126 and read delay setting in programmable RD setting 128. For example, to further evaluate that the write and read test passes for both a write delay setting and a read delay setting, the write check may be re-read five or more times using multiple patterns for each write and read test to further verify that a passing test is truly a passing test.

Figure 6:
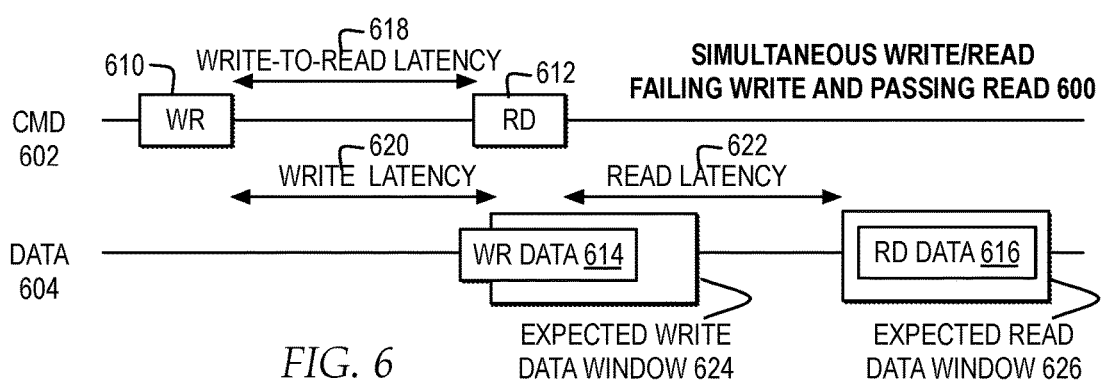
FIG. 6 is a timing diagram illustrating one example of a simultaneous write check, allowing a write delay, which fails, and a read check, allowing a read delay, which passes.

FIG. 6 illustrates one example of a timing diagram of a simultaneous write check, allowing a write delay, which fails, and a read check, allowing a read delay, which passes.

In one example, a timing diagram of a failing write and passing read result from a simultaneous, combined write and read test, with both programmable WR setting 126 and programmable RD setting 128 each simultaneously set to delayed settings before the write and read test is run, compared with both write parameters 112 and read parameters 114 includes time frames for a command (CMD) 602 and data 604. In the example, a time frame for CMD 602 illustrates a write command 610 issued by write control 122, delayed by adjusted programmable WR setting 126. A time frame for data 604 illustrates write control 122 sending write data 614 at a subsequent time after write command 610 is issued. In the example, there is a write latency 620 between the issuance of write command 610 and the front edge of an expected write data window 624. In the example, a horizontal position of expected write data window 624 illustrates the window of time during which the write data is expected to be sent as set in write parameters 112. In addition, for the simultaneous write and read check, a read command 612 may be issued by read control 124, delayed by adjusted programmable RD setting 128, to read data. In one example, there is latency between the time when write command 610 is issued and read command 612 is issued, referred to as a write-to-read latency 618. In the example, there is also a read latency 622 between the time when read command 612 is issued and when the written data is read, as read data 616. In the example in FIG. 6, because the results of the simultaneous write and read test result in write data 614 not writing within expected write data window 624 and read data 516 being read within expected read data window 526, the simultaneous write and read test fails. In response to the write fail, the calibration controller may determine what caused the failure and find a horizontal write edge condition has occurred.

Figure 7:
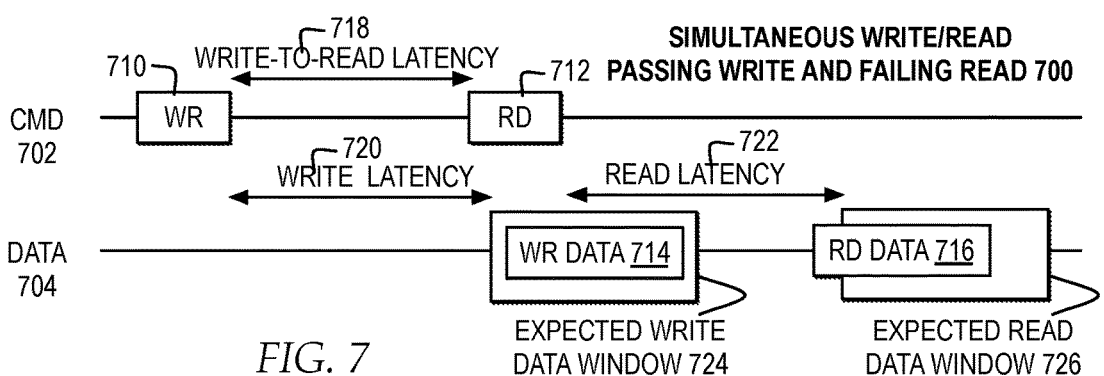
FIG. 7 is a timing diagram illustrating one example of a simultaneous write check, allowing a write delay, which passes, and a read check, allowing a read delay, which fails.

FIG. 7 illustrates one example of a timing diagram of a simultaneous write check, allowing a write delay, which passes, and a read check, allowing a read delay, which fails.

In one example, a timing diagram of a passing write and failing read result from a simultaneous, combined write and read test, with both programmable WR setting 126 and programmable RD setting 128 each simultaneously set to delayed settings before the write and read test is run, compared with both write parameters 112 and read parameters 114 includes time frames for a command (CMD) 702 and data 704. In the example, a time frame for CMD 702 illustrates a write command 710 issued by write control 122, delayed by adjusted programmable WR setting 126. A time frame for data 704 illustrates write control 122 sending write data 714 at a subsequent time after write command 710 is issued. In the example, there is a write latency 720 between the issuance of write command 710 and the front edge of an expected write data window 724. In the example, a horizontal position of expected write data window 724 illustrates the window of time during which the write data is expected to be sent as set in write parameters 112. In addition, for the simultaneous write and read check, a read command 712 may be issued by read control 124, delayed by adjusted programmable RD setting 128, to read data. In one example, there is latency between the time when write command 710 is issued and read command 712 is issued, referred to as a write-to-read latency 718. In the example, there is also a read latency 722 between the time when read command 712 is issued and when the written data is read, as read data 716. In the example in FIG. 7, because the results of the simultaneous write and read test result in write data 714 writing within expected write data window 624, but read data 516 not being read within expected read data window 526, the simultaneous write and read test fails. In response to the read fail, the calibration controller may determine what caused the failure and find a horizontal read edge condition has occurred.

Figure 8:
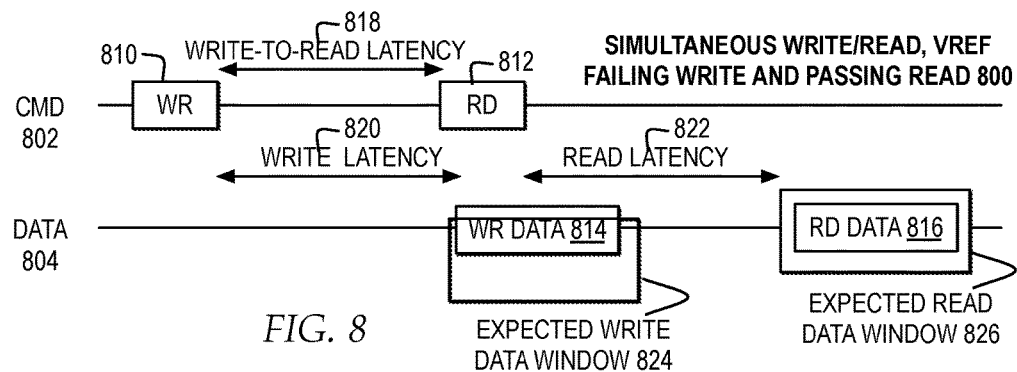
FIG. 8 is a timing diagram illustrating one example of a simultaneous write check, allowing a write VREF setting, which fails, and a read check, allowing a read VREF setting, which passes.

FIG. 8 illustrates one example of a timing diagram of a simultaneous write check, allowing a write VREF setting, which fails, and a read check, allowing a read VREF setting, which passes.

In one example, a timing diagram of a failing write and passing read result from a simultaneous, combined write and read test, with both programmable WR setting 126 and programmable RD setting 128 each simultaneously set to VREF settings before the write and read test is run, compared with both write parameters 112 and read parameters 114 includes time frames for a command (CMD) 802 and data 804. In the example, a time frame for CMD 802 illustrates a write command 810 issued by write control 122, delayed by adjusted programmable WR setting 126. A time frame for data 804 illustrates write control 122 sending write data 814 at a subsequent time after write command 810 is issued.

In the example, there is a write latency 820 between the issuance of write command 810 and the front edge of an expected write data window 824. In the example, the horizontal positioning of expected write data window 824 illustrates the window of time during which the write data is expected to be sent as set in write parameters 112 and the horizontal position of expected read data window 826 illustrates the window of time during which the read data is expected to be read as set in read parameters 114. In addition, for the simultaneous write and read check, a read command 812 may be issued by read control 124, delayed by adjusted programmable RD setting 128, to read data. In one example, there is latency between the time when write command 810 is issued and read command 812 is issued, referred to as a write-to-read latency 818. In the example, there is also a read latency 822 between the time when read command 812 is issued and when the written data is read, as read data 816.

In addition, the vertical positioning of expected write data window 824 illustrates the centering of the voltage reference levels expected between output swing levels for write data and the vertical positioning of expected read data window 826 illustrates the centering of the voltage reference levels expected between output swing levels for read data. In the example in FIG. 8, the results of the simultaneous write and read test result in write data 814 horizontally writing within expected write data window 824, but vertically, write data 814 is not centered within expected write data window 824, therefore the write test fails. In the example, in FIG. 8, the results of the simultaneous write and read test result in read data 816 horizontally and vertically read within expected read data window 826, therefore the read test passes. In response to the write fail, the calibration controller may determine what caused the failure and find a vertical write edge condition has occurred.

Figure 9:
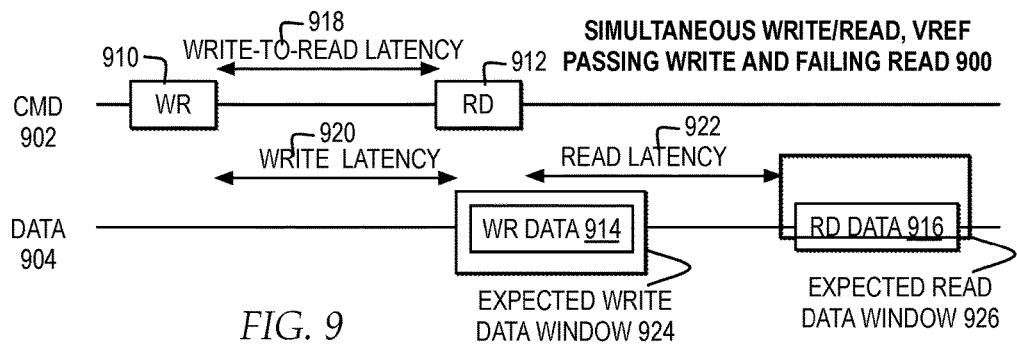
FIG. 9 is a timing diagram illustrating one example of a simultaneous write check, allowing a write VREF setting, which passes, and a read check, allowing a read VREF setting, which fails.

FIG. 9 illustrates one example of a timing diagram of a simultaneous write check, allowing a write VREF setting, which passes, and a read check, allowing a read VREF setting, which fails.

In one example, a timing diagram of a passing write and failing read result from a simultaneous, combined write and read test, with both programmable WR setting 126 and programmable RD setting 128 each simultaneously set to VREF settings before the write and read test is run, compared with both write parameters 112 and read parameters 114 includes time frames for a command (CMD) 902 and data 904. In the example, a time frame for CMD 902 illustrates a write command 910 issued by write control 122, delayed by adjusted programmable WR setting 126. A time frame for data 904 illustrates write control 122 sending write data 914 at a subsequent time after write command 910 is issued.

In the example, there is a write latency 920 between the issuance of write command 910 and the front edge of an expected write data window 924. In the example, the horizontal positioning of expected write data window 924 illustrates the window of time during which the write data is expected to be sent as set in write parameters 112 and the horizontal position of expected read data window 926 illustrates the window of time during which the read data is expected to be read as set in read parameters 114. In addition, for the simultaneous write and read check, a read command 912 may be issued by read control 124, delayed by adjusted programmable RD setting 128, to read data. In one example, there is latency between the time when write command 910 is issued and read command 912 is issued, referred to as a write-to-read latency 918. In the example, there is also a read latency 922 between the time when read command 912 is issued and when the written data is read, as read data 916.

In addition, the vertical positioning of expected write data window 924 illustrates the centering of the voltage reference levels expected between output swing levels for write data and the vertical positioning of expected read data window 926 illustrates the centering of the voltage reference levels expected between output swing levels for read data. In the example in FIG. 9, the results of the simultaneous write and read test result in write data 914 horizontally and vertically centered within expected write data window 924, therefore the write test passes. In the example, in FIG. 9, the results of the simultaneous write and read test result in read data 916 horizontally read within expected read data window 926, but vertically not centered within expected read data window 926, therefore the read test fails. In response to the read fail, the calibration controller may determine what caused the failure and find a vertical read condition has occurred.

Figure 10:
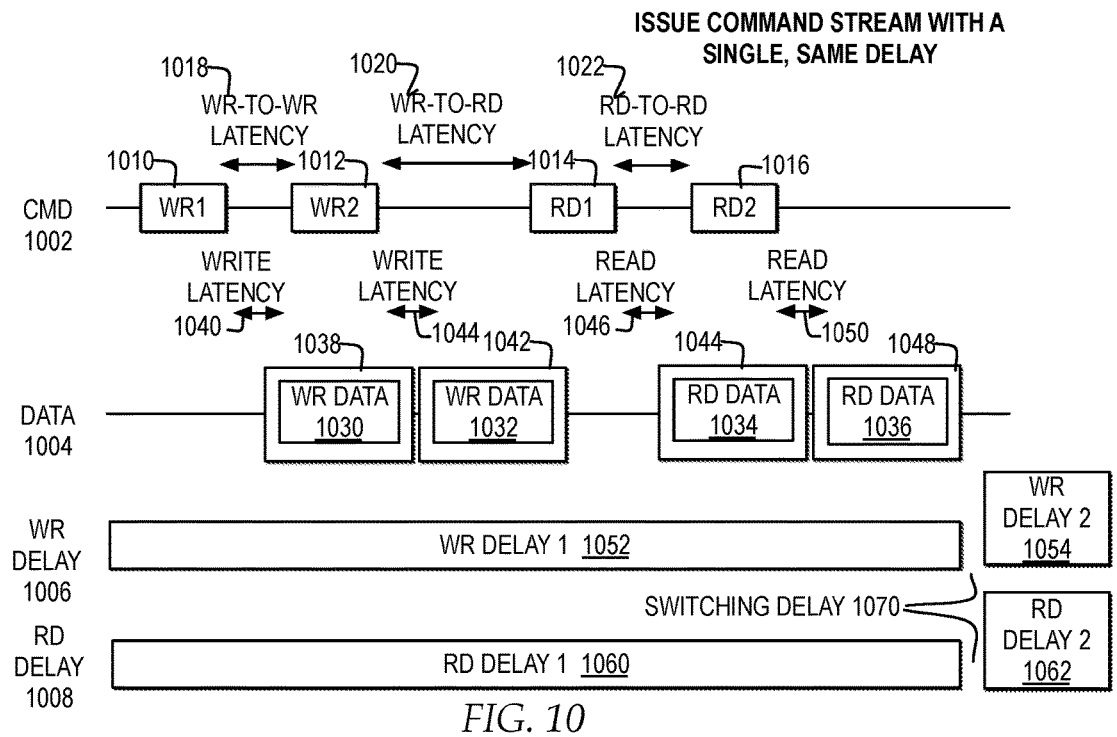
FIG. 10 is a timing diagram illustrating one example of a command stream with multiple write and multiple read commands with the same write and read delays for the entire stream.

FIG. 10 is a timing diagram illustrating one example of a command stream with multiple write and multiple read commands with the same write and read delays for the entire stream.

In one example, a timing diagram of an issue command stream with multiple write commands and multiple read commands and the same delay for the entire stream is illustrated by a command (CMD) 1002, data 1004, WR delay 1006, and RD delay 1008. In the example, a time frame for CMD 1002 illustrates multiple write commands in the stream of WR1 1010 and WR2 1012 and multiple read commands in the stream of RD1 1014 and RD2 1016. In the example, there is a WR-to-WR latency 1018 between WR1 1010 and WR2 1012, a WR-to-RD latency 1020 between WR2 1012 and RD1 1014, and a RD-to-RD latency 1022 between RD1 1014 and RD2 1016.

In the example, the stream of data includes WR data 1030 within an expected write window 1038, after a write latency 1040 and WR data 1032 within an expected write window 1042, after a write latency 1044. In the example, RD data 1034 is within an expected read window 1044 after a read latency 1046 and RD data 1036 is within an expected read window 1048 after a read latency 1050.

In the example, WR is set to a single write delay value illustrated at WR delay 1 1052 and RD is set to a single read delay value illustrated at RD delay 1 1060 for the duration of the stream. In the example, to test a different write delay and read delay, for a subsequent stream, there is a delay, such as switching delay 1070, during the time required to set up and switch to the subsequent stream to be run at WR delay 2 1054 and RD delay 2 1062. However, in the example, by setting both WR delay 1 1052 and RD delay 1 1060 for a streaming test with multiple WR commands and multiple RD commands, a single streaming test is used to test both the WR commands and the RD commands. In contrast, in an example where the WR delay and RD delay are not concurrently set, a first test would be run for the commands with the RD delay and a second test would be run for the commands with the WR delay. While the example illustrates two WR commands and two RD commands, in command streams that include many more WR commands and RD commands, running the test once with the RD delay set and a second time with the WR delay requires at least twice as much testing time as running the single streaming test with both the WR delay setting set and RD delay setting set.

In the example, WR data 1030, WR data 1032, RD data 1034, and RD data 1036 as illustrated within the expected horizontal and vertical edges of the write and read window, in other examples, one or more of WR data 1030, WR data 1032, RD data 1034, and RD data 1036 may fall outside the expected horizontal or vertical edges of the write windows, indicating a failure. In the example, when the same WR or RD delay is set for the entire stream, if a failure is identified in one of the write or read commands, the calibration controller only needs to determine which write or read command identifier triggered the failure to determine the WR delay 1 1052 or RD delay 1 1060 that was set during the failure.

Figure 11:
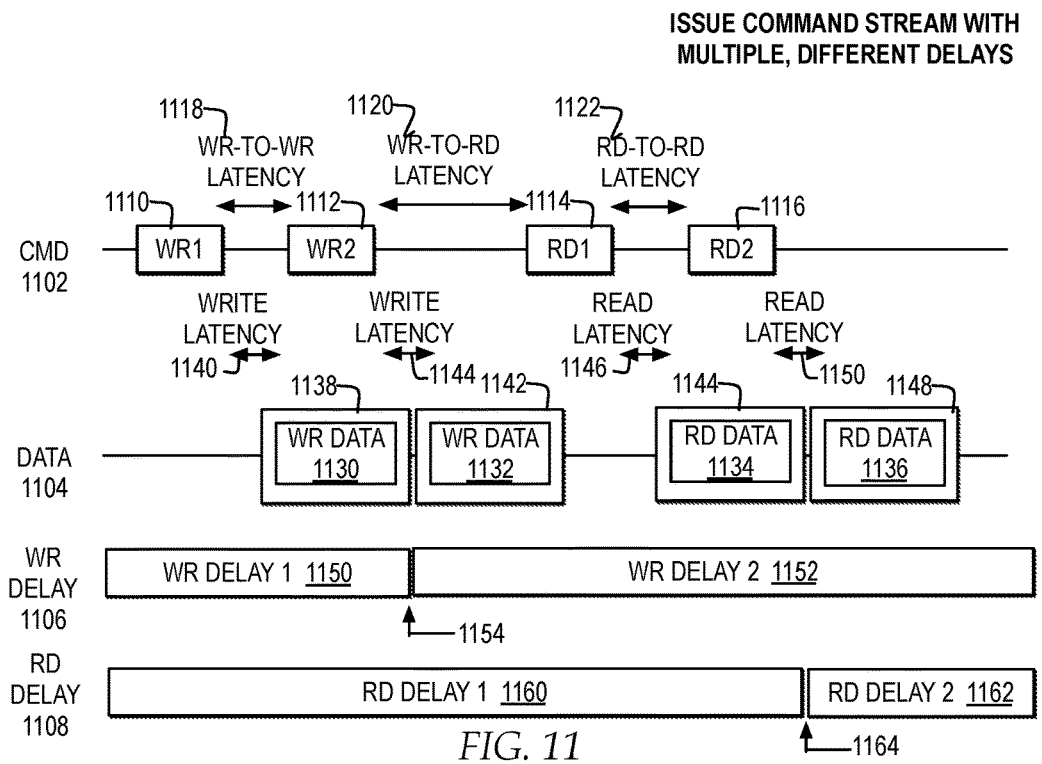
FIG. 11 is a timing diagram illustrating one example of a command stream with multiple write and multiple read commands with the different write delays and different read delays during the stream.

FIG. 11 is a timing diagram illustrating one example of a command stream with multiple write and multiple read commands with the different write delays and different read delays during the stream.

In one example, a timing diagram of an issue command stream with multiple write commands and multiple read commands and the different delays for the entire stream is illustrated by a command (CMD) 1102, data 1104, WR delay 1106, and RD delay 1108. In the example, a time frame for CMD 1102 illustrates multiple write commands in the stream of WR1 1110 and WR2 1112 and multiple read commands in the stream of RD1 1114 and RD2 1116. In the example, there is a WR-to-WR latency 1118 between WR1 1110 and WR2 1112, a WR-to-RD latency 1120 between WR2 1112 and RD1 1114, and a RD-to-RD latency 1122 between RD1 1114 and RD2 1116.

In the example, the stream of data includes WR data 1130 within an expected write window 1138, after a write latency 1140 and WR data 1132 within an expected write window 1142, after a write latency 1144. In the example, RD data 1134 is within an expected read window 1144 after a read latency 1146 and RD data 1136 is within an expected read window 1148 after a read latency 1150.

In the example, each of the WR delay 1106 and RD delay 1108 are set to different delay value during the same stream. In the example, WR delay 1150 is set to a first value of a first WR delay 1 1150 for a first period and switched at reference numeral 1154, with no switching delay, to a second, different value of a second WR delay 2 1152 for a second period, during the stream. In the example, RD delay 1160 is set to a first value of a first RD delay 1 1160 for a first period and switched at reference numeral 1164, with no switching delay, to a second, different value of a second RD delay 2 1162 for a second period, during the stream. In the example, during a same stream, multiple write delay settings and multiple read delay settings are tested for multiple write commands and multiple read commands without any switching delay between the write delay changes or read delay changes.

While in the example in FIG. 11 only two WR delay settings and two RD delay settings are illustrated, in other examples additional numbers of WR delay settings and additional numbers of RD settings may be required for testing. For example, a range of 10 delay settings may need to be tested for each of the WR delay setting and the RD delay setting. If the calibration controller were not enabled for configuring the WR delay settings and RD delay settings concurrently, the calibration controller would need to set the RD delay setting 10 times and the WR delay setting 10 times, requiring 20 settings of delays, which between testing streams introduces delays. In the example in FIG. 11, the calibration controller is not only enabled to set both the WR delay setting and the RD delay setting at the same time, but also sets multiple delay settings for a single test stream, which minimizes the calibration time required to switch between delay settings.

In the example, WR data 1130, WR data 1132, RD data 1134, and RD data 1136 as illustrated within the expected horizontal and vertical edges of the write and read window, in other examples, one or more of WR data 1130, WR data 1132, RD data 1134, and RD data 1136 may fall outside the expected horizontal or vertical edges of the write windows, indicating a failure. In the example in FIG. 11, if a failure is identified in one of the write or read commands, the calibration controller needs to determine which write or read command identifier triggered the failure and then determine whether the identified command is associated with a first delay value or a second delay value within WR delay 1 1150, WR delay 2 1152, RD delay 1 1160, and RD delay 2 1162. As illustrated in FIG. 11, by including multiple write commands and multiple read commands in a same stream and by setting the WR delay and RD delay to different settings, multiple WR delay and RD delay settings may be tested within a single testing stream, to minimize the number of times that a testing stream is required to be run to test different WR delay and RD delay settings and to minimize the delay of switching between different WR delay and RD delay for multiple testing streams illustrated in FIG. 10.

Figure 12:
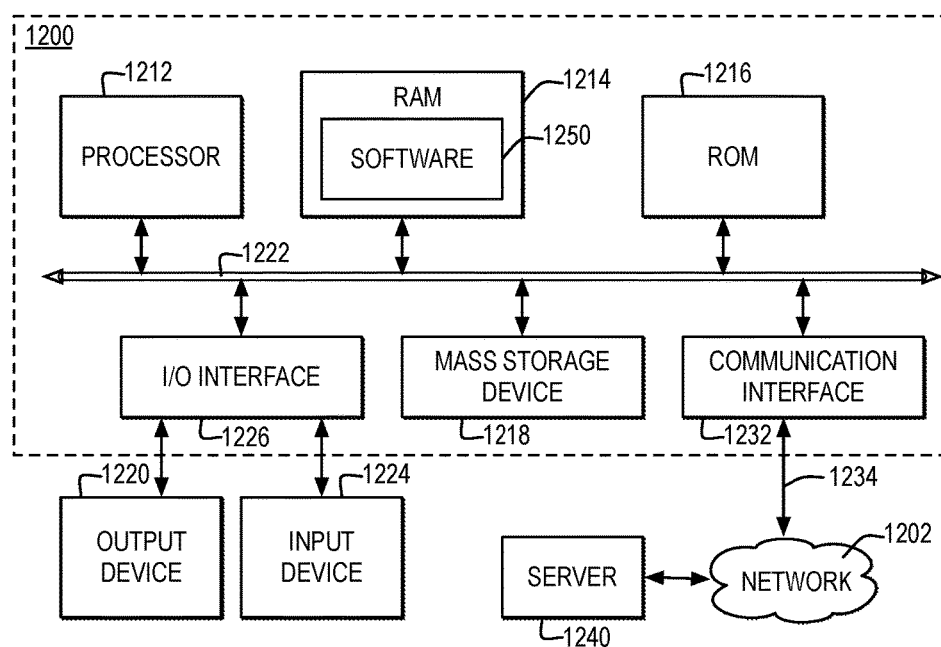
FIG. 12 is a block diagram illustrating one example of a computer system in which one embodiment of the invention may be implemented.

FIG. 12 illustrates a block diagram of one example of a computer system in which one embodiment of the invention may be implemented. The present invention may be performed in a variety of systems and combinations of systems, made up of functional components, such as the functional components described with reference to a computer system 1200 and may be communicatively connected to a network, such as network 1202.

Computer system 1200 includes a bus 1222 or other communication device for communicating information within computer system 1200, and at least one hardware processing device, such as processor 1212, coupled to bus 1222 for processing information. Bus 1222 preferably includes low-latency and higher latency paths that are connected by bridges and adapters and controlled within computer system 1200 by multiple bus controllers. When implemented as a server or node, computer system 1200 may include multiple processors designed to improve network servicing power.

Processor 1212 may be at least one general-purpose processor that, during normal operation, processes data under the control of software 1250, which may include at least one of application software, an operating system, middleware, and other code and computer executable programs accessible from a dynamic storage device such as random access memory (RAM) 1214, a static storage device such as Read Only Memory (ROM) 1216, a data storage device, such as mass storage device 1218, or other data storage medium. Software 1250 may include, but is not limited to, code, applications, protocols, interfaces, and processes for controlling one or more systems within a network including, but not limited to, an adapter, a switch, a server, a cluster system, and a grid environment.

Computer system 1200 may communicate with a remote computer, such as server 1240, or a remote client. In one example, server 1240 may be connected to computer system 1200 through any type of network, such as network 1202, through a communication interface, such as network interface 1232, or over a network link that may be connected, for example, to network 1202.

In the example, multiple systems within a network environment may be communicatively connected via network 1202, which is the medium used to provide communications links between various devices and computer systems communicatively connected. Network 1202 may include permanent connections such as wire or fiber optics cables and temporary connections made through telephone connections and wireless transmission connections, for example, and may include routers, switches, gateways and other hardware to enable a communication channel between the systems connected via network 1202. Network 1202 may represent one or more of packet-switching based networks, telephony based networks, broadcast television networks, local area and wire area networks, public networks, and restricted networks.

Network 1202 and the systems communicatively connected to computer 1200 via network 1202 may implement one or more layers of one or more types of network protocol stacks which may include one or more of a physical layer, a link layer, a network layer, a transport layer, a presentation layer, and an application layer. For example, network 1202 may implement one or more of the Transmission Control Protocol/Internet Protocol (TCP/IP) protocol stack or an Open Systems Interconnection (OSI) protocol stack. In addition, for example, network 1202 may represent the worldwide collection of networks and gateways that use the TCP/IP suite of protocols to communicate with one another. Network 1202 may implement a secure HTTP protocol layer or other security protocol for securing communications between systems.

In the example, network interface 1232 includes an adapter 1234 for connecting computer system 1200 to network 1202 through a link and for communicatively connecting computer system 1200 to server 1240 or other computing systems via network 1202. Although not depicted, network interface 1232 may include additional software, such as device drivers, additional hardware and other controllers that enable communication. When implemented as a server, computer system 1200 may include multiple communication interfaces accessible via multiple peripheral component interconnect (PCI) bus bridges connected to an input/output controller, for example. In this manner, computer system 1200 allows connections to multiple clients via multiple separate ports and each port may also support multiple connections to multiple clients.

Figure 13:
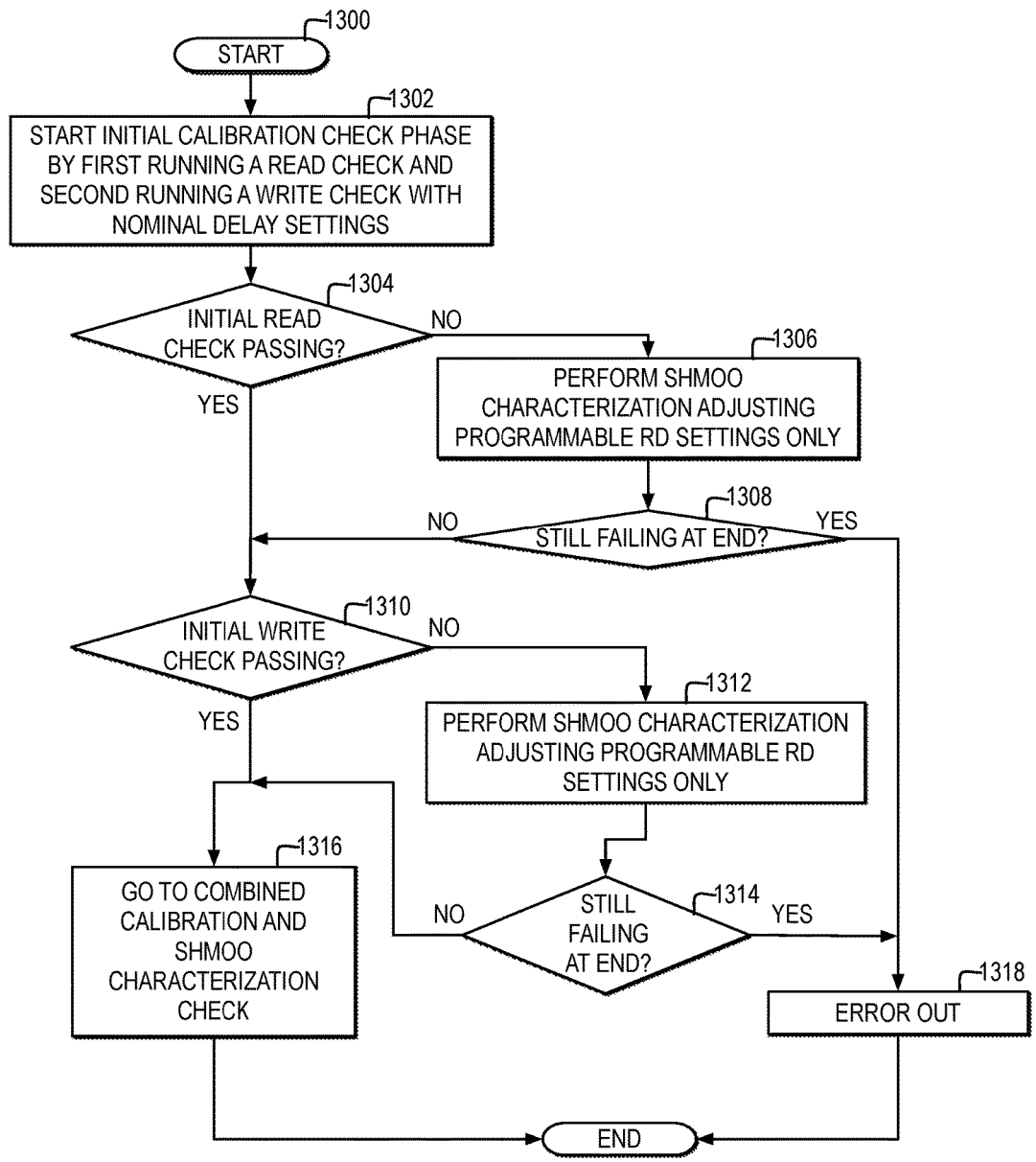
FIG. 13 is a high level logic flowchart of a process and computer program for performing each of an initial read check and an initial write check in a first phase of a combined calibration check.
Figure 14:
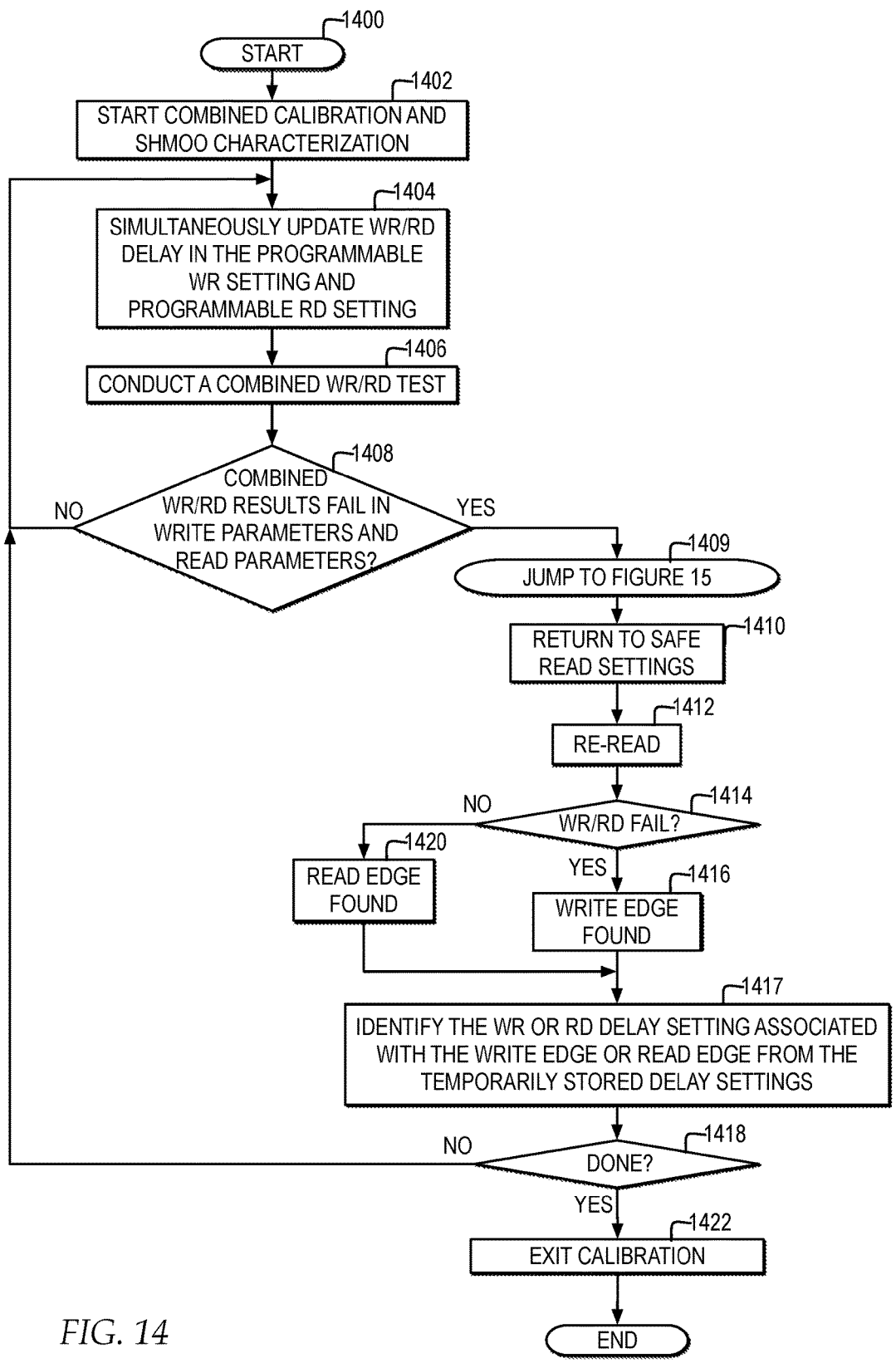
FIG. 14 is a high level logic flowchart of a process and computer program for performing a simultaneous, combined write and read test in a second phase of a combined calibration check.
Figure 15:
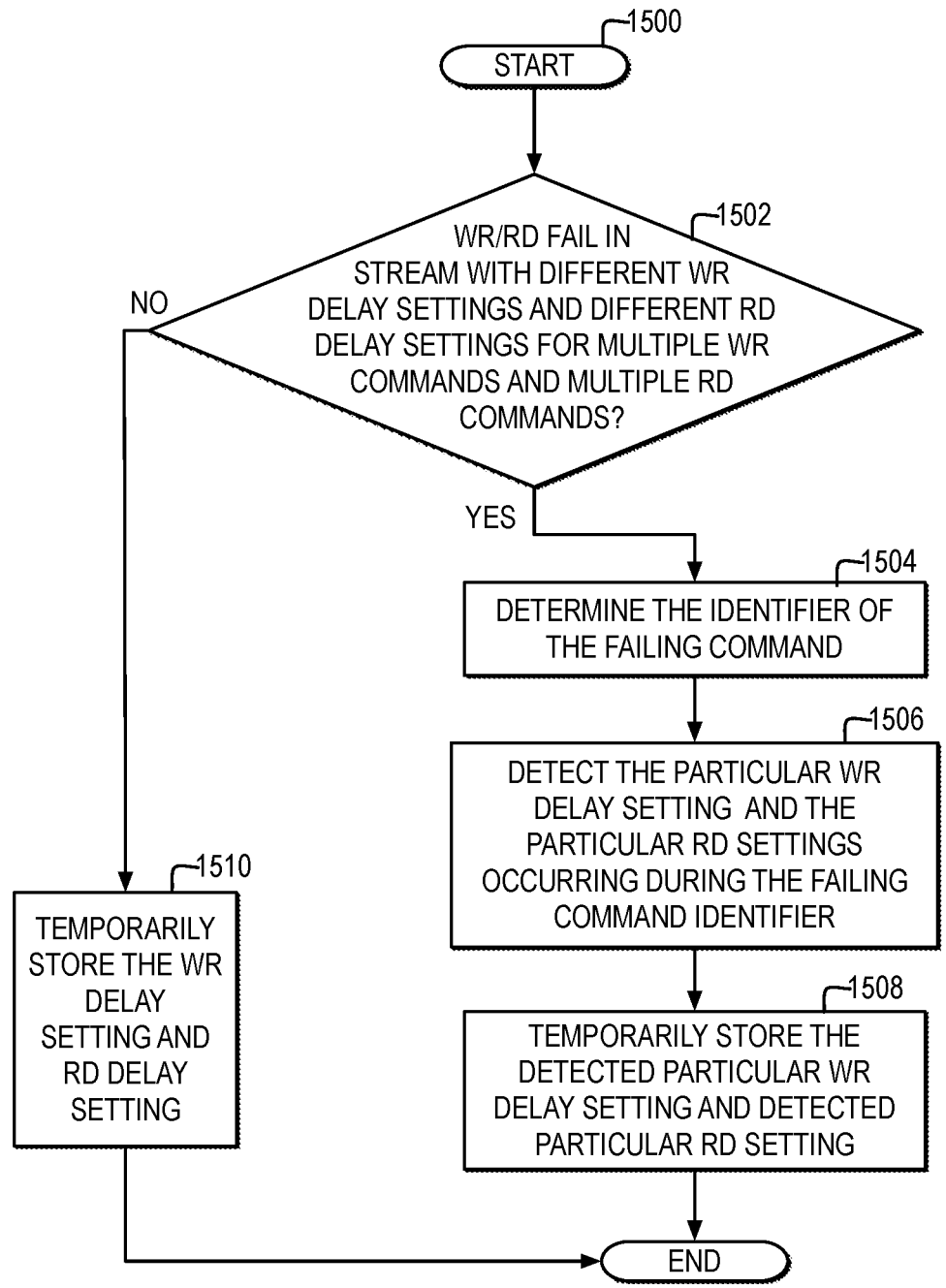
FIG. 15 is a high level logic flowchart of a process and computer program for determining the write delay setting and read delay setting for a failed command within a stream including multiple write and read commands, multiple write settings, and multiple read settings.

In one embodiment, the operations performed by processor 1212 may control the operations of flowchart of FIGS. 13-15 and other operations described herein. Operations performed by processor 1212 may be requested by software 1250 or other code or the steps of one embodiment of the invention might be performed by specific hardware components that contain hardwired logic for performing the steps, or by any combination of programmed computer components and custom hardware components. In one embodiment, one or more components of computer system 1200, or other components, which may be integrated into one or more components of computer system 1200, may contain hardwired logic for performing the operations of flowcharts in FIGS. 13-15.

In addition, computer system 1200 may include multiple peripheral components that facilitate input and output. These peripheral components are connected to multiple controllers, adapters, and expansion slots, such as input/output (I/O) interface 1226, coupled to one of the multiple levels of bus 1222. For example, input device 1224 may include, for example, a microphone, a video capture device, an image scanning system, a keyboard, a mouse, or other input peripheral device, communicatively enabled on bus 1222 via I/O interface 1226 controlling inputs. In addition, for example, output device 1220 communicatively enabled on bus 1222 via I/O interface 1226 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 12, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage rice, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 12 may vary. Furthermore, those of ordinary skill in the art will appreciate that the depicted example is not meant to imply architectural limitations with respect to the present invention.

FIG. 13 illustrates a high level logic flowchart of a process and computer program for performing each of an initial read check and an initial write check in a first phase of a combined calibration check.

As illustrated, in one example, a process and computer program begin at block 1300 and thereafter proceed to block 1302. Block 1302 illustrates starting an initial calibration check phase by first running a read check, allowing for a programmable RD settings delay, and second running a write check, allowing for a programmable WR settings delay, with nominal delay settings. Next, block 1304 illustrates a determination whether an initial read check is passing the read parameters.

At block 1304, if the initial read check is passing, then the process passes to block 1310, which is described below. At block 1304, if the initial read check is not passing, then the process passes to block 1306. Block 1306 illustrates performing shmoo characterization, adjusting the programmable RD settings only. Next, block 1308 illustrates a determination whether the read check is still failing at the end. At block 1308, if the read check is still failing at the end, then the process passes to block 1318. Block 1318 illustrates an error out, and the process ends. Returning to block 1308, if the read check is not still failing at the end, then the current RD delay setting is set as a safe setting and the process passes to block 1310.

At block 1310, if the initial write check is passing, then the process passes to block 1316. Block 1316 illustrates going to the combined calibration and shmoo characterization check, and the process ends. Returning to block 1310, at block 1310, if the initial write check is not passing, then the process passes to block 1312. Block 1312 illustrates performing shmoo characterization, adjusting the programmable WR settings only. Next, block 1314 illustrates a determination whether the write check is still failing at the end. At block 1314, if the write check is still failing at the end, then the current WR delay settings is set as a safe setting the process passes to block 1318. Returning to block 1314, if the write check is not still failing at the end, then the process passes to block 1316.

FIG. 14 illustrates a high level logic flowchart of a process and computer program for performing a simultaneous, combined write and read test in a second phase of a combined calibration check.

In one example, a process and computer program start at block 1400 and thereafter proceed to block 1402. Block 1402 illustrates starting the combined calibration and shmoo characterization, which may be triggered by block 1316 of FIG. 13 or may be independently triggered. Next, block 1404 illustrates simultaneously updating the delay settings in both the programmable WR setting and the programmable RD setting to adjust the delay in both settings. In the example, by setting the WR delay settings and RD delay settings simultaneously, a combined write and read test can be performed once, rather than a first time for the WR delay setting and a second time for the RD delay setting. In addition, by setting the WR delay settings and RD delay settings simultaneously, different delays may be set to run during the streamed test for each of the WR delay settings and the RD delay settings, so that a single streaming test can test both WR delay settings and RD delay settings and test multiple different WR delay settings and multiple different RD delay settings. Thereafter, block 1406 illustrates conducting a combined write and read test. Next, block 1408 illustrates a determination whether the combined write and read results fail for the write parameters and read parameters. In one example, a write and read fail may include a read fail only, a write fail only, or both a read and write fail. At block 1408, if there is not a write and read fail, then the process returns to block 1404. At block 1408, if there is a write and read fail, then the process passes to block 1409. Block 1409 illustrates jumping to FIG. 15. When the process returns from FIG. 15, the process passes to block 1410.

Block 1410 illustrates returning the programmable RD setting to a safe read setting that has previously passed. Next, block 1412 illustrates re-reading the read portion of the combined write and read test. Thereafter, block 1414 illustrates a determination whether there is a write and read fail for the write parameters and read parameters. At block 1414, if there is not a write and read fail, then the process passes to block 1420. Block 1420 illustrates finding a horizontal or vertical read edge for the current settings and results, and the process passes to block 1417. Returning to block 1414, if there is a write and read fail, then the process passes to block 1416. Block 1416 illustrates finding a horizontal or vertical write edge for the current settings and results, and the process passes to block 1417. Block 1417 illustrates identifying the WR or RD delay setting associated with the write edge or read edge from the temporarily stored delay settings, and the process passes to block 1418.

Block 1418 illustrates a determination whether the combined write and read testing is done. In one example, once one or more horizontal and vertical read edges and one or more horizontal and vertical write edges are found, the combined write and read testing is done. At block 1418, if the combined write and read testing is not done, then the process returns to block 1404. At block 1418, if the combined write and read testing is done, then the process passes to block 1422. Block 1422 illustrates exiting the calibration, and the process ends.

FIG. 15 illustrates a high level logic flowchart of a process and computer program for determining the write delay setting and read delay setting for a failed command within a stream including multiple write and read commands, multiple write settings, and multiple read settings.

In one example, a process and computer program start at block 1500 and thereafter proceed to block 1502. Block 1502 illustrates a determination whether a WR/RD fail is detected in a stream with different WR delay settings and different RD delay settings for multiple WR commands and multiple RD commands. At block 1502, if the WR/RD fail is not detected in a stream with different WR delay settings and different RD delay settings for multiple WR commands and multiple RD commands, then the process passes to block 1510. Block 1510 illustrates temporarily storing the WR delay setting and the RD delay setting used for the stream, and the process ends. Returning to block 1502, at block 1502, if the WR/RD fail is detected in a stream with different WR delay settings and different RD delay settings for multiple WR commands and multiple RD commands, then the process passes to block 1504. Block 1504 illustrates determining the identifier of the failing command. Next, block 1506 illustrates detecting the particular WR delay setting and the particular RD setting occurring during the failing command identifier. In one example, the particular WR delay setting and the particular RD setting occurring during the failing command identifier may be detected from one or more types of data storage devices, including, but not limited to, one or more of a series of counters, working registers, and muxes, that may be used to track the outstanding read and write commands and the associated delay values with each of the commands. Thereafter, block 1508 illustrates temporarily storing the detected particular WR delay setting and the detected particular RD delay setting, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method comprising:
    testing an electronic circuit with an initial separate read check allowing for a read delay;
    responsive to the read check results of the initial separate read check not passing, performing a first shmoo characterization adjusting the read delay only;
    responsive to the read check results failing at the end of the first shmoo characterization, ending the testing of the electronic circuit with an error;
    responsive to the read check results passing at the end of the first shmoo characterization, testing the electronic circuit with an initial separate write check allowing for a write delay;
    responsive to the write check results of the initial separate write check not passing, performing a second shmoo characterization adjusting the write delay only;
    responsive to the write check results failing at the end of the second shmoo characterization, ending the testing of the electronic circuit with an error; and
    responsive to the write check results passing at the end of the second shmoo characterization, for each condition of a range of conditions, iteratively performing, a write test with the write delay concurrent with a read test with the read delay on the electronic circuit over the range of conditions while simultaneously adjusting the write delay and the read delay for each iteration until one or more of a read edge and a write edge are detected.

2. The method according to claim 1, further comprising: adjusting each condition of the range of conditions comprising one or more of a voltage, a reference voltage, a frequency, a timing parameter, and a temperature refresh rate while calibrating a first value set as the write delay and a second value set as the read delay.

3. The method according to claim 1, wherein responsive to passing the initial separate read check and the initial separate write check, for each condition of the range of conditions, iteratively performing, the write test with the write delay concurrently with the read test with the read delay on the electronic circuit over the range of conditions while simultaneously adjusting the write delay and the read delay for each iteration until one or more of the read edge and the write edge are detected further comprises:
    responsive to passing the initial separate read check and the initial separate write check, iteratively performing the write test with the write delay of a write timing delay setting concurrently with the read test with the read delay of a read timing delay over the range of conditions on the electronic circuit while simultaneously adjusting the write delay and adjusting the read delay for each iteration until one or more of a horizontal edge of the read edge and a horizontal edge of the write edge are detected.

4. The method according to claim 1, wherein responsive to passing the initial separate read check and the initial separate write check, for each condition of the range of conditions, iteratively performing, the write test with the write delay concurrently with the read test with the read delay on the electronic circuit over the range of conditions while simultaneously adjusting the write delay and the read delay for each iteration until one or more of the read edge and the write edge are detected further comprises:
    responsive to passing the initial separate read check and the initial separate write check, iteratively performing the write test with the write delay of a write voltage reference setting concurrently with the read test with the read delay of a read voltage reference setting over the range of conditions on the electronic circuit while simultaneously adjusting the write delay and adjusting the read delay for each iteration until one or more of a vertical edge of the read edge and a vertical edge of the write edge are detected.

5. The method according to claim 1, further comprising: testing the electronic circuit, wherein the electronic circuit comprises one of an integrated circuit with one or more dynamic random access memories, an application specific integrated circuit, and a microprocessor.

6. The method according to claim 1, further comprising: adjusting the write delay for adjusting the writing timing on a write interface between a memory controller and a memory of the electronic circuit; and
    adjusting the read delay for adjusting the read timing on a read interface between the memory controller and the memory of the electronic circuit.

7. The method according to claim 1, further comprising: checking read check results of the separate read check against one or more read parameters specified for read timing within the electronic circuit, wherein the one or more read parameters specify whether the read check results pass or fail;
    checking write check results of the separate write check against one or more write parameters specified for write timing within the electronic circuit, wherein the one or more write parameters specify whether the write check results pass or fail; and
    checking combined results of the simultaneous write test and read test against the one or more write parameters and the one or more read parameters.

8. The method according to claim 1, wherein responsive to passing the initial separate read check and the initial separate write check, for each condition of the range of conditions, iteratively performing, the write test with the write delay concurrently with the read test with the read delay on the electronic circuit over the range of conditions while simultaneously adjusting the write delay and the read delay for each iteration until one or more of the read edge and the write edge are detected further comprises:
    checking combined results of the simultaneous write test and read test against one or more write parameters specified for write timing within the electronic circuit and one or more read parameters specified for read timing within the electronic circuit, wherein the one or more write parameters specify whether the write test passes or fails, wherein the one or more read parameters specify whether the read test passes or fails;

responsive to detecting the combined results of the simultaneous write test and read test fail:
returning the read delay to a safe setting that has previously passed testing for the one or more read parameters; and
rereading updated combined results of the simultaneous write test and read test with the read delay set to the safe setting;
checking updated combined results of the simultaneous write test and read test against the one or more write parameters specified and the one or more read parameters;
responsive to detecting the updated combined results of the simultaneous write test and read test fail, detecting the write edge; and
responsive to detecting the updated combined results of the simultaneous write test and read test pass, detecting the read edge.

9. The method according to claim 8, further comprising:
responsive to detecting one of the write edge and the read edge, iteratively performing simultaneously the write test with the write delay and the read test with the read delay over the range of conditions on the electronic circuit while simultaneously adjusting the write delay and adjusting the read delay for each iteration until both the write edge and the read edge are detected.

10. A computer system comprising one or more processors, one or more computer-readable memories, one or more computer-readable storage devices, and program instructions, stored on at least one of the one or more storage devices for execution by at least one of the one or more processors via at least one of the one or more memories, the stored program instructions comprising:
program instructions to test an electronic circuit with an initial separate read check allowing for a read delay;
program instructions to, responsive to the read check results of the initial separate read check not passing, perform a first shmoo characterization adjusting the read delay only;
program instructions to, responsive to the read check results failing at the end of the first shmoo characterization, end the testing of the electronic circuit with an error;
program instructions to, responsive to the read check results passing at the end of the first shmoo characterization, test the electronic circuit with an initial separate write check allowing for a write delay;
program instructions to, responsive to the write check results of the initial separate write check not passing, perform a second shmoo characterization adjusting the write delay only;
program instructions to, responsive to the write check results failing at the end of the second shmoo characterization, end the testing of the electronic circuit with an error; and
program instructions, responsive to the write check results passing at the end of the second shmoo characterization, for each condition of a range of conditions, to iteratively perform, a write test with the write delay concurrent with a read test with the read delay on the electronic circuit over the range of conditions while simultaneously adjusting the write delay and the read delay for each iteration until one or more of a read edge and a write edge are detected.

11. The computer system according to claim 10, the stored program instructions further comprising:
program instructions to adjust each condition of the range of conditions comprising one or more of a voltage, a reference voltage, a frequency, a timing parameter, and a temperature refresh rate while calibrating a first value set as the write delay and a second value set as the read delay.

12. The computer system according to claim 10, the stored program instructions further comprising:
program instructions, responsive to passing the initial separate read check and the initial separate write check, to iteratively perform the write test with the write delay of a write timing delay setting concurrent with the read test with the read delay of a read timing delay over the range of conditions on the electronic circuit while simultaneously adjusting the write delay and adjusting the read delay for each iteration until one or more of a horizontal edge of the read edge and a horizontal edge of the write edge are detected.

13. The computer system according to claim 10, the stored program instructions further comprising:
program instructions, responsive to passing the initial separate read check and the initial separate write check, to iteratively perform the write test with the write delay of a write voltage reference setting concurrent with the read test with the read delay of a read voltage reference setting over the range of conditions on the electronic circuit while simultaneously adjusting the write delay and adjusting the read delay for each iteration until one or more of a vertical edge of the read edge and a vertical edge of the write edge are detected.

14. The computer system according to claim 10, the stored program instructions further comprising:
program instructions to test the electronic circuit, wherein the electronic circuit comprises one of an integrated circuit with one or more dynamic random access memories, an application specific integrated circuit, and a microprocessor.

15. The computer system according to claim 10, the stored program instructions further comprising:
program instructions to adjust the write delay for adjusting the writing timing on a write interface between a memory controller and a memory of the electronic circuit; and
program instructions to adjust the read delay for adjusting the read timing on a read interface between the memory controller and the memory of the electronic circuit.

16. The computer system according to claim 10, the stored program instructions further comprising:
program instructions to check read check results of the separate read check against one or more read parameters specified for read timing within the electronic circuit, wherein the one or more read parameters specify whether the read check results pass or fail;
program instructions to check write check results of the separate write check against one or more write parameters specified for write timing within the electronic circuit, wherein the one or more write parameters specify whether the write check results pass or fail; and
program instructions to check combined results of the simultaneous write test and read test against the one or more write parameters and the one or more read parameters.

17. A computer program product comprising one or more computer-readable storage devices and program instructions, stored on at least one of the one or more storage devices, the stored program instructions comprising:

program instructions to test an electronic circuit with an initial separate read check allowing for a read delay;

program instructions to, responsive to the read check results of the initial separate read check not passing, perform a first shmoo characterization adjusting the read delay only;

program instructions to, responsive to the read check results failing at the end of the first shmoo characterization, end the testing of the electronic circuit with an error;

program instructions to, responsive to the read check results passing at the end of the first shmoo characterization, test the electronic circuit with an initial separate write check allowing for a write delay;

program instructions to, responsive to the write check results of the initial separate write check not passing, perform a second shmoo characterization adjusting the write delay only;

program instructions to, responsive to the write check results failing at the end of the second shmoo characterization, end the testing of the electronic circuit with an error; and program instructions, responsive to the write check results passing at the end of the second shmoo characterization, for each condition of a range of conditions, to iteratively perform, a write test with the write delay concurrent with a read test with the read delay on the electronic circuit over the range of conditions while simultaneously adjusting the write delay and the read delay for each iteration until one or more of a read edge and a write edge are detected.

18. The computer program product according to claim 17, the stored program instructions further comprising:

program instructions to adjust each condition of the range of conditions comprising one or more of a voltage, a reference voltage, a frequency, a timing parameter, and a temperature refresh rate while calibrating a first value set as the write delay and a second value set as the read delay.

\* \* \* \* \*